US012666524B2

(12) United States Patent
Kim et al.

(10) Patent No.: US 12,666,524 B2
(45) Date of Patent: Jun. 23, 2026

(54) HOME APPLIANCE AND HEAT SINK INSTALLED THEREIN

(71) Applicant: LG ELECTRONICS INC., Seoul (KR)

(72) Inventors: Mijung Kim, Seoul (KR); Junghyeon Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1007 days.

(21) Appl. No.: 17/826,261

(22) Filed: May 27, 2022

(65) Prior Publication Data

US 2022/0386447 A1 Dec. 1, 2022

(30) Foreign Application Priority Data

May 28, 2021 (KR) ........................ 10-2021-0069404

(51) Int. Cl.
| | |
|---|---|
| *H05K 1/00* | (2006.01) |
| *F24C 15/00* | (2006.01) |
| *H05B 6/04* | (2006.01) |
| *H05K 1/02* | (2006.01) |
| *H05K 7/20* | (2006.01) |
| *H05B 6/12* | (2006.01) |

(52) U.S. Cl.
CPC ......... *H05K 1/0203* (2013.01); *F24C 15/006* (2013.01); *H05B 6/04* (2013.01); *H05K 7/20136* (2013.01); *H05K 7/2039* (2013.01); *H05B 6/12* (2013.01)

(58) Field of Classification Search
CPC ............. H05K 1/0203; H05K 7/20136; H05K 7/2039; F24C 15/006; H05B 6/04; H05B 6/12

USPC .......................................................... 361/702
See application file for complete search history.

(56) References Cited

U.S. PATENT DOCUMENTS

| | | | |
|---|---|---|---|
| 5,828,549 A | 10/1998 | Gandre et al. | |
| 6,997,247 B2 * | 2/2006 | Malone ................. | F28D 1/0478 |
| | | | 257/E23.098 |

(Continued)

FOREIGN PATENT DOCUMENTS

| | | | |
|---|---|---|---|
| EP | 2 292 979 | 3/2011 | |
| EP | 2679913 A2 * | 1/2014 | ............ F24C 15/101 |

(Continued)

OTHER PUBLICATIONS

Korean Office Action dated Jul. 16, 2025, issued in Application No. 10-2021-0069404.

(Continued)

*Primary Examiner* — Zhengfu J Feng
(74) *Attorney, Agent, or Firm* — KED & ASSOCIATES

(57) ABSTRACT

A home appliance is provided that may include a first air flow path included in a heat sink, and a second air flow path defined at a lower side of the heat sink, such that air flows to inside and outside of the heat sink efficiently. A plurality of heat dissipation fins may protrude downward from a wall of the second air flow path, increasing a contact surface between the heat sink and air. A projection may be formed on at least one of the walls of the first air flow path, the walls of the second air flow path, an outer surface of the plurality of heat dissipation fins, or an upper surface of the heat sink.

18 Claims, 30 Drawing Sheets
(6 of 30 Drawing Sheet(s) Filed in Color)

71

(56)                    References Cited

U.S. PATENT DOCUMENTS

| 2004/0035554 | A1* | 2/2004 | Sato | F28F 3/04 |
| | | | | 29/890.035 |
| 2008/0142512 | A1* | 6/2008 | Kim | F24C 15/101 |
| | | | | 219/757 |
| 2008/0259566 | A1* | 10/2008 | Fried | H05K 7/20809 |
| | | | | 165/80.4 |

FOREIGN PATENT DOCUMENTS

| EP | 2679913 | 8/2019 |
| EP | 3 651 550 | 5/2020 |
| ES | 2 447 690 | 3/2014 |
| JP | 2001-196511 | 7/2001 |
| KR | 10-2008-0054883 | 6/2008 |

OTHER PUBLICATIONS

European Search Report issued in Application No. 22175977.2 dated Sep. 29, 2022.

* cited by examiner

FIG. 12

Heat-Sink Top View

FIG. 21

(at 1200 sec, °C)

| Case | Power | Heatsink Type | Left | | | | | Right | | | | |
|---|---|---|---|---|---|---|---|---|---|---|---|---|
| | | | BD | IGBT-1 | IGBT-2 | IGBT-3 | IGBT-4 | BD | IGBT-1 | IGBT-2 | IGBT-3 | IGBT-4 |
| Case 1 | Left 100% Right 100% | Vertical | 186.3 | 227.9 | 233.9 | 228.8 | 230.1 | 191.7 | 200.6 | 207.5 | 212.7 | 214.6 |
| | | Horizontal | 173.8 | 216.6 | 222.3 | 217.9 | 219.6 | 177.8 | 186.1 | 192.3 | 197.4 | 199.6 |
| | Left 70% Right 70% | Vertical | 141.3 | 169.2 | 173.6 | 170.1 | 171.1 | 149.5 | 149.9 | 154.9 | 158.7 | 160.2 |
| | | Horizontal | 130.4 | 159.9 | 164.7 | 161.7 | 162.9 | 132.9 | 139.1 | 143.6 | 147.3 | 149.0 |
| | Left 100% Right 0% | Vertical | 133.0 | 171.3 | 175.7 | 168.9 | 169.7 | 94.6 | 96.0 | 101.8 | 105.2 | 106.4 |
| | | Horizontal | 128.5 | 168.5 | 173.4 | 167.2 | 168.1 | 81.7 | 84.0 | 88.1 | 91.4 | 92.8 |
| | Left 0% Right 100% | Vertical | 95.1 | 86.8 | 86.8 | 90.6 | 91.3 | 128.5 | 132.5 | 136.0 | 139.2 | 139.1 |
| | | Horizontal | 73.3 | 75.5 | 77.5 | 79.5 | 80.3 | 123.6 | 129.5 | 132.7 | 134.9 | 136.0 |

FIG. 23

| Case | Power (%) | | Left | | | | | Right | | | | | (at 1200 sec, ℃) |
|---|---|---|---|---|---|---|---|---|---|---|---|---|---|
| | Left | Right | BO | IGBT1 | IGBT2 | IGBT3 | IGBT4 | BO | IGBT1 | IGBT2 | IGBT3 | IGBT4 | |
| Default | 100 | 0 | 124.0 | 166.0 | 169.8 | 163.6 | 164.5 | 79.9 | 83.8 | 86.9 | 89.8 | 90.4 | |
| | 0 | 100 | 71.9 | 74.2 | 75.9 | 77.9 | 78.7 | 121.9 | 131.4 | 134.4 | 136.3 | 136.1 | |
| 1 | 100 | 0 | 121.6 | 163.6 | 167.8 | 162.0 | 162.9 | 77.5 | 81.8 | 85.1 | 88.2 | 88.9 | |
| | 0 | 100 | 70.2 | 72.6 | 74.5 | 76.8 | 77.6 | 119.6 | 129.4 | 132.7 | 134.8 | 134.7 | |
| 2 | 100 | 0 | 122.9 | 166.7 | 170.4 | 164.2 | 164.7 | 70.3 | 74.8 | 78.2 | 81.8 | 82.8 | |
| | 0 | 100 | 65.0 | 67.4 | 69.0 | 71.0 | 71.8 | 115.7 | 126.1 | 129.8 | 132.7 | 132.9 | |
| 3 | 100 | 0 | 112.9 | 153.9 | 157.2 | 150.7 | 151.4 | 81.9 | 86.6 | 90.1 | 93.1 | 93.7 | |
| | 0 | 100 | 74.4 | 76.5 | 78.2 | 80.1 | 80.8 | 112.0 | 121.1 | 124.0 | 125.9 | 125.9 | |
| 4 | 100 | 0 | 112.1 | 152.2 | 158.1 | 153.8 | 154.8 | 69.9 | 74.9 | 77.6 | 80.6 | 81.6 | |
| | 0 | 100 | 63.7 | 65.5 | 67.9 | 70.8 | 71.8 | 113.7 | 125.1 | 127.4 | 129.4 | 129.4 | |
| 5 | 100 | 0 | 121.2 | 163.0 | 166.5 | 159.0 | 159.5 | 76.7 | 80.4 | 83.1 | 85.8 | 87.0 | |
| | 0 | 100 | 70.1 | 72.1 | 73.6 | 75.2 | 75.9 | 119.5 | 128.5 | 131.1 | 132.7 | 133.6 | |
| 6 | 100 | 0 | 108.0 | 150.0 | 154.2 | 147.5 | 148.5 | 67.1 | 70.8 | 73.4 | 76.1 | 77.3 | |
| | 0 | 100 | 61.2 | 63.7 | 65.5 | 67.5 | 68.4 | 111.9 | 121.2 | 123.5 | 125.1 | 125.9 | |

BD

IGBT 1

IGBT 2

IGBT 3

IGBT 4

<Defaul, Case 1~3>   < Case 4>   < Case 5>

| Case | Power | | | |
|---|---|---|---|---|
| | Left 100 % | Right 0 % | Left 0 % | Right 100 % |
| Default | | | | |
| Case 1 | | | | |
| Case 2 | | | | |
| Case 3 | | | | |

FIG. 27

| Case | Power (%) | | Left | | | | | Right | | | | | (at 1200 sec, ℃) |
| | Left | Right | BO | IGBT1 | IGBT2 | IGBT3 | IGBT4 | BO | IGBT1 | IGBT2 | IGBT3 | IGBT4 | |
|---|---|---|---|---|---|---|---|---|---|---|---|---|---|
| Default | 100 | 0 | 124.0 | 166.0 | 169.3 | 166.6 | 164.5 | 79.3 | 85.8 | 86.9 | 89.8 | 90.4 | |
| | 0 | 100 | 71.9 | 74.2 | 75.9 | 77.9 | 78.7 | 121.3 | 131.4 | 134.4 | 136.3 | 136.1 | |
| Case 1 | 100 | 0 | 119.2 | 160.5 | 165.4 | 160.7 | 161.1 | 76.5 | 80.5 | 82.7 | 85.6 | 86.4 | |
| | 0 | 100 | 68.1 | 70.6 | 72.7 | 75.3 | 76.0 | 121.0 | 130.3 | 131.7 | 133.3 | 133.2 | |
| Case 2 | 100 | 0 | 119.3 | 161.0 | 166.5 | 162.0 | 163.1 | 75.5 | 77.4 | 80.1 | 82.9 | 84.2 | |
| | 0 | 100 | 67.3 | 69.3 | 71.4 | 74.0 | 74.9 | 116.3 | 122.0 | 124.4 | 125.3 | 126.7 | |
| Case 3 | 100 | 0 | 128.3 | 169.8 | 173.7 | 169.1 | 169.5 | 81.1 | 81.9 | 85.3 | 87.6 | 89.5 | |
| | 0 | 100 | 73.0 | 74.2 | 76.1 | 78.6 | 79.3 | 119.9 | 124.0 | 127.3 | 127.8 | 129.6 | |
| Case 4 | 100 | 0 | 85.0 | 191.1 | 191.3 | 181.5 | 181.3 | 46.0 | 101.9 | 102.5 | 105.4 | 105.6 | |
| | 0 | 100 | 52.9 | 82.5 | 83.8 | 85.1 | 85.8 | 103.4 | 143.0 | 143.5 | 144.1 | 143.6 | |
| Case 5 | 100 | 0 | 111.9 | 152.4 | 156.8 | 171.7 | 171.6 | 68.0 | 71.0 | 72.3 | 94.5 | 95.2 | |
| | 0 | 100 | 63.3 | 64.4 | 65.5 | 66.9 | 91.4 | 114.1 | 124.1 | 125.9 | 136.3 | 138.5 | |

Temperature

| Case | Power | |
| --- | --- | --- |
| | Left 100 %<br>Right 0 % | Left 0 %<br>Right 100 % |
| Default | | |
| Case 1 | | |
| Case 2 | | |

FIG. 29

(at 1200 sec, ℃)

| Case | Power (%) | | Left | | | | | Right | | | | |
|---|---|---|---|---|---|---|---|---|---|---|---|---|
| | Left | Right | BD | IGBT1 | IGBT2 | IGBT3 | IGBT4 | BD | IGBT1 | IGBT2 | IGBT3 | IGBT4 |
| Default | 100 | 0 | 124.0 | 166.0 | 169.8 | 163.6 | 164.5 | 79.3 | 83.8 | 86.9 | 69.8 | 90.4 |
| | 0 | 100 | 71.9 | 74.2 | 75.9 | 77.9 | 78.7 | 121.9 | 131.4 | 134.4 | 136.3 | 136.1 |
| 1 | 100 | 0 | 119.1 | 164.0 | 167.6 | 161.6 | 162.6 | 63.0 | 68.0 | 70.7 | 74.0 | 74.8 |
| | 0 | 100 | 57.9 | 60.9 | 62.4 | 64.8 | 65.5 | 118.3 | 131.0 | 133.9 | 136.4 | 136.5 |
| 2 | 100 | 100 | 148.0 | 192.5 | 200.1 | 197.0 | 197.4 | 154.4 | 170.1 | 175.9 | 181.1 | 182.1 |
| | 100 | 0 | 109.0 | 151.7 | 158.5 | 151.2 | 151.2 | 72.1 | 77.4 | 80.4 | 84.2 | 85.1 |

Case 1 : 6mm
Case 2 : 7mm
Case 3 : 8mm

Case 4

Case 5

(at 1200 sec. °C)

| Case | Power (%) Left | Power (%) Right | Left BD | Left IGBT1 | Left IGBT2 | Left IGBT3 | Left IGBT4 | Right BD | Right IGBT1 | Right IGBT2 | Right IGBT3 | Right IGBT4 |
|------|------|------|------|------|------|------|------|------|------|------|------|------|
| Default | 100 | 0 | 124.0 | 160.0 | 159.8 | 163.6 | 164.5 | 79.3 | 83.8 | 86.9 | 89.6 | 90.4 |
|  | 0 | 100 | 71.9 | 74.2 | 75.9 | 77.9 | 78.7 | 121.3 | 131.4 | 134.4 | 136.3 | 136.1 |
| Case 1 | 100 | 0 | 109.0 | 151.7 | 156.5 | 151.2 | 151.2 | 72.1 | 77.4 | 80.4 | 84.2 | 85.1 |
|  | 0 | 100 | 85.7 | 68.5 | 70.7 | 73.3 | 73.9 | 109.0 | 119.5 | 121.8 | 124.2 | 124.3 |
| Case 2 | 100 | 0 | 110.6 | 154.0 | 158.5 | 151.6 | 151.9 | 73.7 | 79.2 | 82.3 | 85.9 | 86.5 |
|  | 0 | 100 | 67.2 | 70.1 | 72.3 | 74.3 | 74.9 | 110.4 | 121.2 | 123.5 | 126.5 | 125.5 |
| Case 3 | 100 | 0 | 112.6 | 155.3 | 160.1 | 153.7 | 153.6 | 75.6 | 81.0 | 84.1 | 87.7 | 88.6 |
|  | 0 | 100 | 68.7 | 71.6 | 73.7 | 75.9 | 76.5 | 112.1 | 122.9 | 125.1 | 127.3 | 127.3 |
| Case 4 | 100 | 0 | 111.0 | 154.3 | 158.8 | 152.7 | 152.8 | 74.1 | 79.8 | 82.9 | 86.4 | 97.2 |
|  | 0 | 100 | 67.4 | 70.4 | 72.6 | 74.8 | 75.4 | 110.8 | 121.7 | 124.1 | 126.0 | 126.0 |
| Case 5 | 100 | 0 | 113.7 | 157.4 | 161.6 | 154.7 | 155.2 | 76.6 | 82.3 | 85.4 | 89.1 | 90.0 |
|  | 0 | 100 | 89.7 | 72.6 | 74.7 | 76.8 | 77.5 | 112.9 | 123.8 | 126.1 | 126.3 | 123.4 |

FIG. 33

(at 1200 sec. t)

| Case | Power (%) | | Left | | | | | Right | | | | |
|---|---|---|---|---|---|---|---|---|---|---|---|---|
| | Left | Right | BD | IGBT1 | IGBT2 | IGBT3 | IGBT4 | BD | IGBT1 | IGBT2 | IGBT3 | IGBT4 |
| Default | 100 | 0 | 124.0 | 166.0 | 169.8 | 163.6 | 164.5 | 79.3 | 89.8 | 86.9 | 89.8 | 90.4 |
| | 0 | 100 | 71.9 | 74.2 | 75.9 | 77.9 | 78.7 | 121.3 | 131.4 | 134.4 | 136.3 | 136.1 |
| Case 1 | 100 | 100 | 148.0 | 192.6 | 200.1 | 197.0 | 197.4 | 154.4 | 170.1 | 175.3 | 181.1 | 182.1 |
| | 100 | 0 | 109.0 | 151.7 | 156.5 | 151.2 | 151.2 | 72.1 | 77.4 | 80.4 | 84.2 | 85.1 |
| | 0 | 100 | 65.7 | 68.5 | 70.7 | 73.3 | 73.9 | 109.0 | 119.5 | 121.8 | 124.2 | 124.3 |

HOME APPLIANCE AND HEAT SINK INSTALLED THEREIN

CROSS-REFERENCE TO RELATED APPLICATION(S)

This application claims priority to and benefit of Korean Patent Application No. 10-2021-0069404, filed in Korea on May 28, 2021, which is hereby incorporated by reference as when fully set forth herein.

BACKGROUND

1. Field

A home appliance, and a heat sink installed therein are disclosed herein.

2. Background

Various types of cooking appliances are used to heat food or other items (hereinafter, collectively "food") at homes or restaurants. The cooking appliances include gas ranges using gas and electric ranges using electricity.

The electric ranges are classified as resistance heating-type electric ranges and induction heating-type electric ranges. In terms of electrical resistance heating, electric current is supplied to a metallic resistance wire or a non-metallic heat generation element, such as silicon carbide, to generate heat, and the generated heat is radiated or conducted to heat an object to be heated, for example, a cooking container, such as a pot, or a frying pan, for example. In terms of induction heating, high-frequency power is supplied to a coil to generate a magnetic field around the coil, and eddy current produced in the generated magnetic field is used to heat an object to be heated made of a metallic material.

In basic theories of induction heating, when electric current is supplied to a working coil or a heating coil, heat is generated while an object to be heated is inductively heated, and the object to be heated is heated by the generated heat. Additionally, electric ranges are provided with a drive circuit for driving a heater, such as a working coil, for example. The drive circuit is embodied by a plurality of electronic elements, and the plurality of electronic elements is disposed on a printed circuit board.

In this case, heat is generated as the electronic elements operate, increasing a temperature in the electric range. Additionally, as the heater operates, the temperature in the electric range increases further. An increase in the temperature of the electronic elements themselves causes damage to the electronic elements and operational errors of the electric range. To cool the electronic elements, a heat sink is mounted on a printed circuit board.

FIG. 1 is a perspective view showing a heat sink included in a related art home appliance. FIG. 1 is from the drawings (FIG. 1) of EP 2,679,913 B1, which is hereby incorporated by reference.

Referring to FIG. 1, as an induction apparatus, the home appliance 10a includes an electronic unit 40a, a heat sink unit 20a, and a fan unit 30a. The electronic unit 40a is comprised of two electronic circuit boards 42a, 44a that generate high-frequency AC. Each of the electronic boards 42a, 44a includes five electric power components 46a.

The heat sink unit 20a is comprised of two heat sinks 22a, 24a that are spaced from each other. The heat sink 22a, 24a connects to any one of the electronic circuit boards 42a, 44a.

The heat sink 22a, 24a has five cooling pins that are arranged horizontally in a basic shape in relation to a standard operational orientation of each home appliance 10a. The basic shape includes a slant accommodation area 23a, 25a that is provided for thermal contact of an electric power component 46a.

The fan unit 30a includes a radial fan 32a. The fan unit 30a is surrounded by the heat sink unit 20a. The fan unit 30a includes a fan cover 34a that partially overlaps the heat sink 22a, 24a. The fan cover 34a includes a suction opening 36a. The fan unit 30a and the heat sink unit 20a form two different cooling channels 60a, 62a. The fan unit 30a and the heat sink unit 20a are arranged symmetrically in a double layer with respect to a rotational axis 38a of the radial fan 32a. The cooling channels 60a, 62a are formed to face each other.

Most of the air output from the fan unit 30a flows into the heat sink unit 20a. A temperature of the heat sink unit 20a is reduced by the air, and a temperature of the electric power component 46a is decreased by the reduced temperature of the heat sink unit 20a. That is, as the air output from the fan unit 30a is not directly delivered to the electric power component 46a, the electric power component 46a indirectly cools.

A method of indirect cooling used in the home appliance 10a of FIG. 1 is less efficient in cooling than a method of direct cooling.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments will be described in detail with reference to the following drawings in which like reference numerals refer to like elements, and wherein:

FIG. 12 is a cross-sectional view of the components of FIG. 10;

FIGS. 19 to 33 are views for describing results of simulation according to an embodiment.

DETAILED DESCRIPTION

Figure 1:
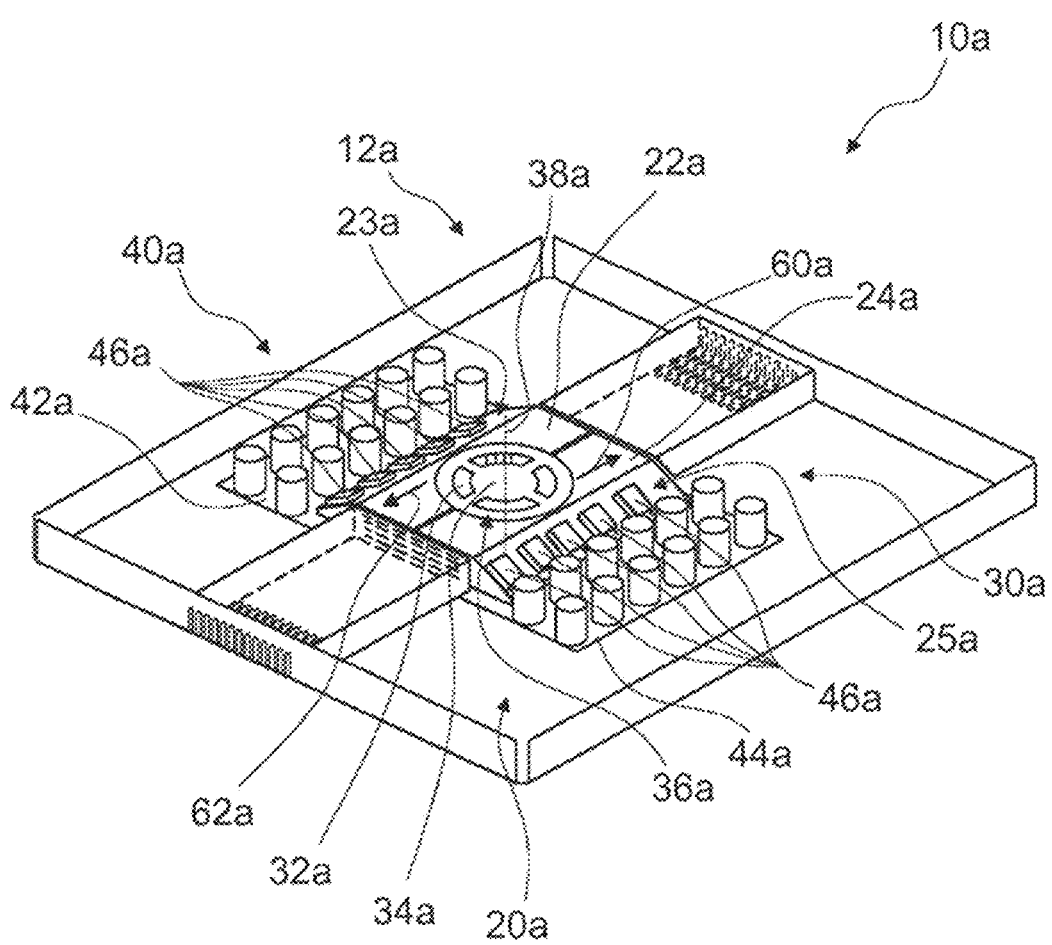
FIG. 1 is a perspective view showing a heat sink included in a related art home appliance.

Embodiments are described hereinafter with reference to the accompanying drawings such that one having ordinary skill in the art to which the embodiments pertain may embody the technical spirit easily. Herein, description of known technologies in relation to the embodiments is omitted if it is deemed to make the gist unnecessarily vague. Hereinafter, embodiments are described with reference to the accompanying drawings. In the drawings, identical reference numerals can denote identical or similar components.

The terms "first", "second" and the like are used herein only to distinguish one component from another component. Thus, the components should not be limited by the terms. Certainly, a first component can be a second component unless stated to the contrary.

Throughout, each component can be provided as a single one or a plurality of ones, unless explicitly stated to the contrary.

The singular forms "a", "an" and "the" are intended to include the plural forms as well, unless explicitly indicated otherwise. It should be further understood that the terms "comprise" or "include" and the like, set forth herein, are not interpreted as necessarily including all the stated components or steps but can be interpreted as excluding some of the stated components or steps or can be interpreted as including additional components or steps.

Throughout, the terms "A and/or B" as used herein can denote A, B or A and B, and the terms "C to D" can denote C or greater and D or less, unless stated to the contrary.

Throughout, an "upward-downward direction" denotes an upward-downward direction of an electric range in a state in which the electric range is installed for use. A "leftward-rightward direction" denotes a direction orthogonal to the upward-downward direction, and a "frontward-rearward direction" denotes a direction orthogonal to the upward-downward direction and the leftward-rightward direction. "Both lateral directions" or a "lateral direction" may have the same meaning as the leftward-rightward direction. These terms can be mixedly used herein.

Additionally, on the coordinate axis in the drawings, the x-axis and the x-axis direction are referred to as the front or the rear, the y-axis and the y-axis direction are referred to as the right direction and the left direction, and the z-axis and the z-axis direction are referred to as the upward direction and the downward direction.

Figure 2:
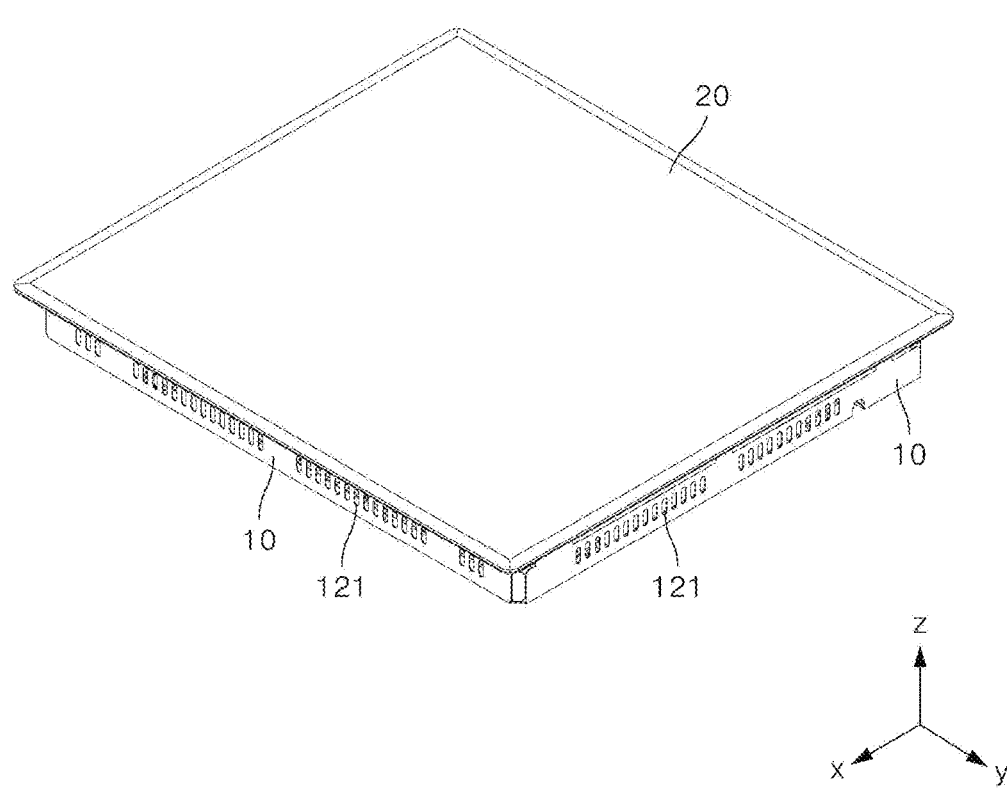
FIG. 2 is a perspective view of an electric range according to an embodiment.
Figure 3:
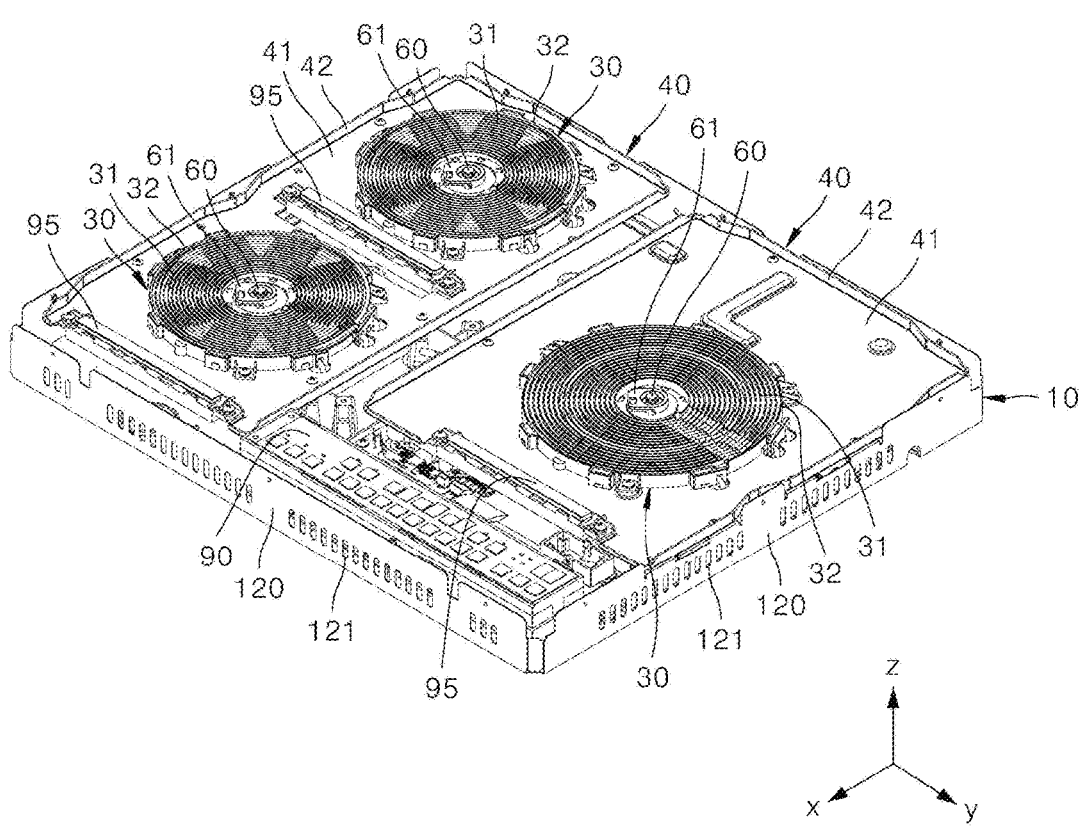
FIG. 3 is a perspective view of the electric range of FIG. 2 without some components.
Figure 4:
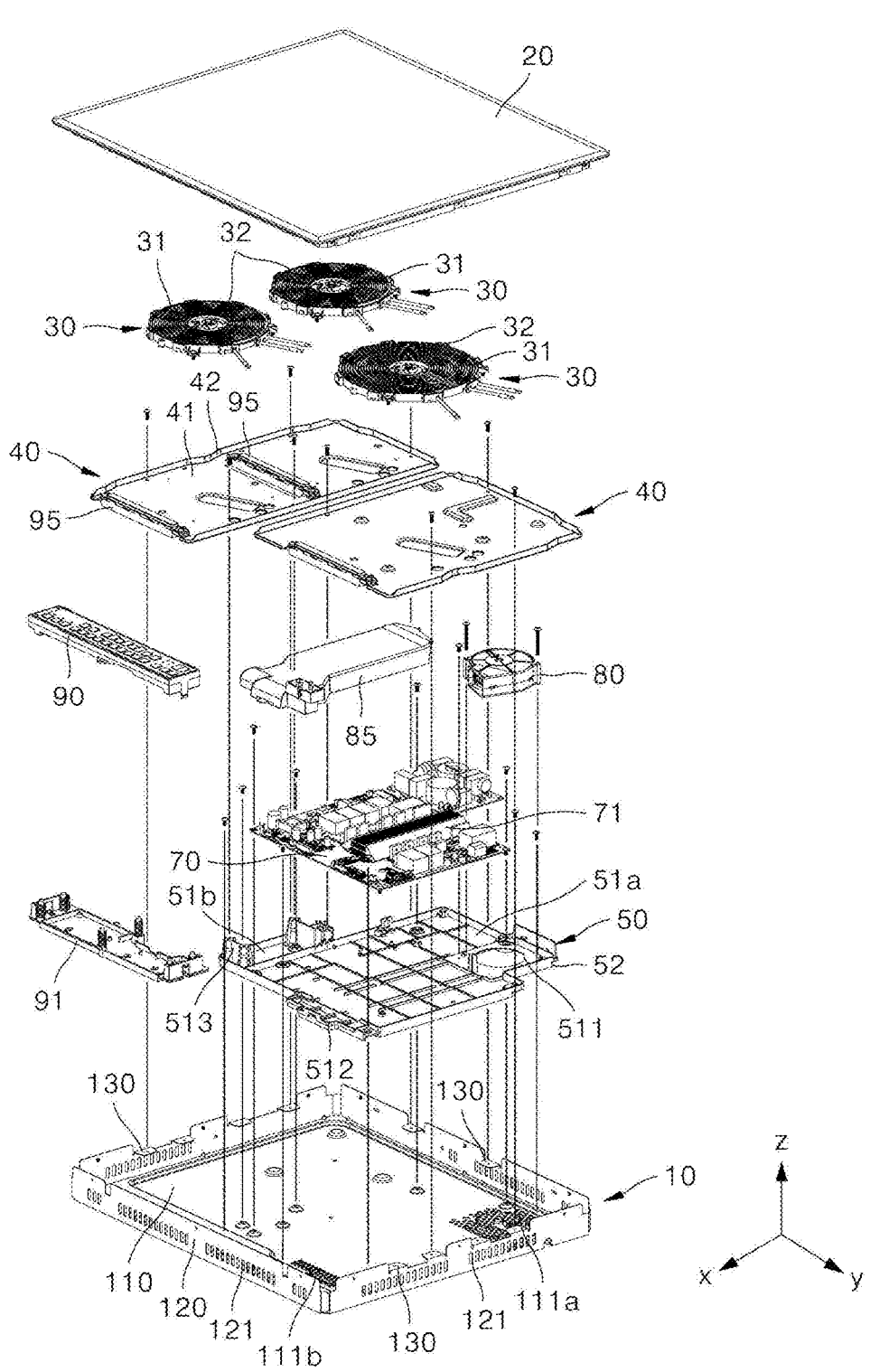
FIG. 4 is an exploded perspective view of the electric range of FIG. 2.
Figure 5:
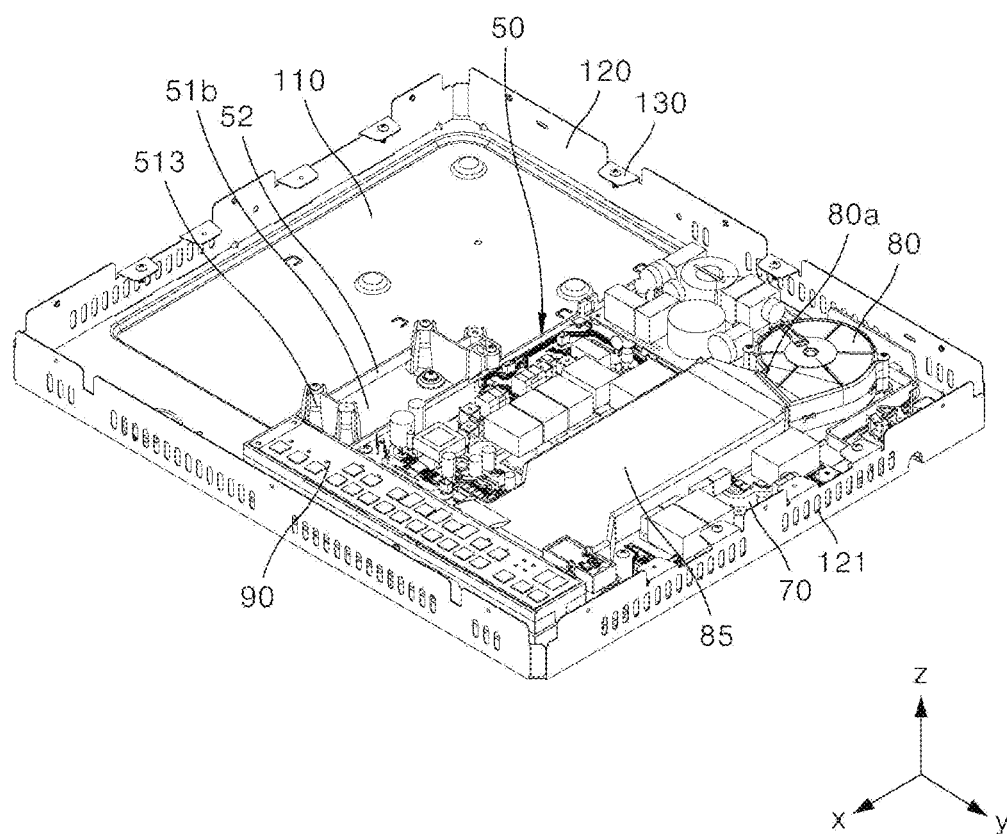
FIG. 5 is a perspective view showing some components of the electric range according to an embodiment.
Figure 6:
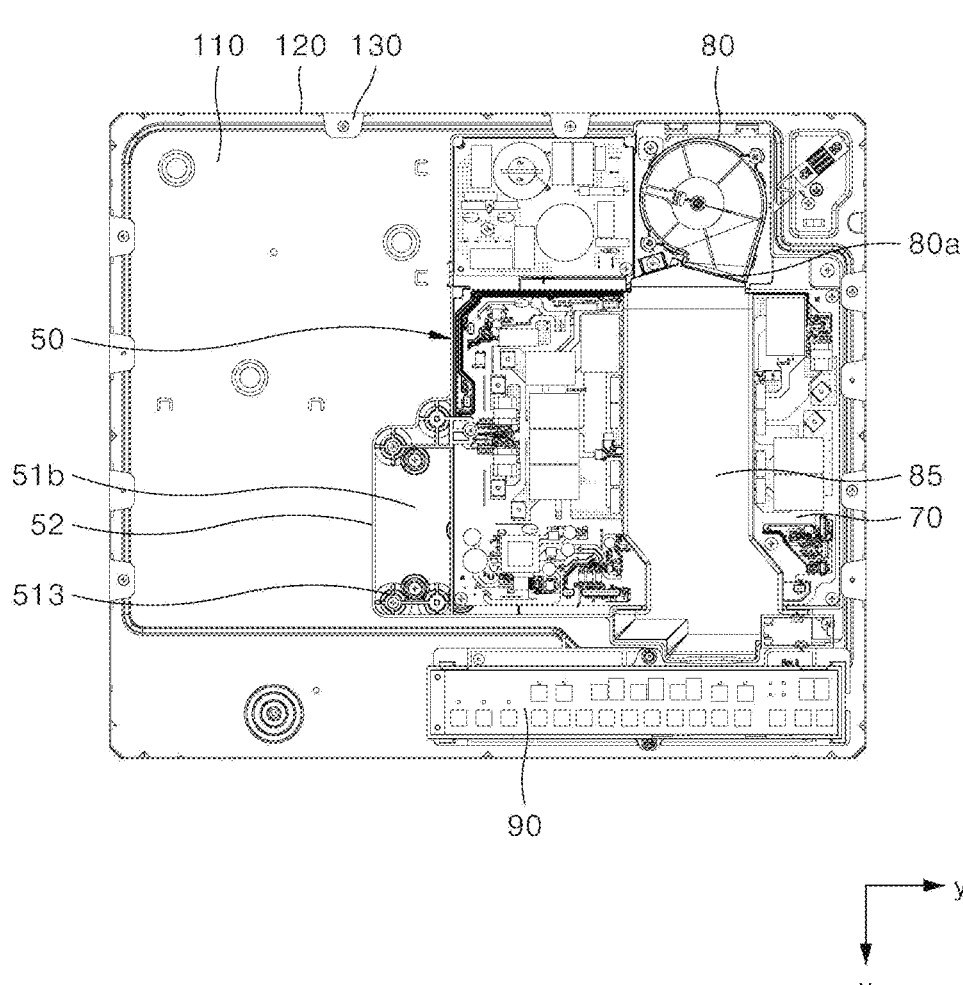
FIG. 6 is a plan view of the components FIG. 5.

FIG. 2 is a perspective view of an electric range according to an embodiment. FIG. 3 is a perspective view of the electric range of FIG. 2 without some components. FIG. 4 is an exploded perspective view of the electric range of FIG. 2. FIG. 5 is a perspective view showing some components of the electric range of FIG. 2. FIG. 6 is a plan view of the component of FIG. 5.

Referring to FIGS. 2 to 6, the electric range according to an embodiment may be a home appliance in which a heat sink 71 is mounted on a printed circuit board 70 on which a drive circuit is disposed. Accordingly, the configuration of the electric range, described hereafter, may be applied to a home appliance including the heat sink 71 in the same way.

The electric range according to an embodiment may heat an object to be heated based on induction heating. In this case, the object to be heated may be a cooking container containing metal, such as stainless steel, or iron, for example.

The induction heating method involves supplying high-frequency power to a working coil 31 to generate a magnetic field around the working coil 31, and heating an object to be heated made of metal, using eddy current produced by the generated magnetic field.

That is, as high-frequency power is supplied to a heating part or heater 30 having a structure in which the working coil 31 is adjacent to a ferrite core, a magnetic field is generated around the working coil 31. As an object to be heated is placed in an area of the generated magnetic field, eddy current is induced to the object to be heated by the magnetic field, and Joule's heat is generated by the eddy current, thereby heating the object to be heated. As the object to be heated is heated, a food item contained in the object to be heated is heated and cooked.

The electric range according to the embodiment may include a case 10, a cover plate 20, the heater 30, an upper bracket 40, and a base bracket 50. The case 10 may protect components constituting the electric range. For example, the case 10 may be made of aluminum; however, embodiments are not limited thereto. Additionally, the case 10 may be thermally insulated to suppress the release of heat generated by the working coil 31 to the outside.

The case 10 may store components, such as the heater 30, the upper bracket 40, and a control board 90, for example, that constitute the electric range. An upper portion of the case 10 may be open, and the open portion may be closed by the cover plate 20. The case 10 may be entirely formed into a box by processing plate-shaped materials, for example.

The case 10 may include a first casing 110, a second casing 120, and a third casing 130. The first casing 110 may form a bottom surface of the case 10. The first casing 110 may support the above-described built-in components of the electric range.

The first casing 110 may be provided with at least one of vents 111*a*, 111*b*. At least one of the vents 111*a*, 111*b* may allow air to flow, to smoothly cool the printed circuit board 70 disposed in the first casing 110, and circuit elements or electronic elements mounted on the printed circuit board 70.

The second casing 120 may be bent from the first casing 110, and form a lateral surface of the case 10. The second casing 120 may vertically bend from an edge of the first casing 110, and become the lateral wall of the electric range.

The second casing 120 may be disposed on each side of the first casing 110 entirely formed into a rectangle. The second casing 120 may improve an entire rigidity of the case 10. That is, the second casing 120 may be formed in such a way that it bends from the first casing 110 to suppress bending of the plate-shaped first casing 110 or damage caused by a weight of the built-in components or an external force.

The second casing 120 may further include a plurality of exhaust holes 121 formed into a slit, for example. The exhaust holes 121 allow an inside and outside of the case 10 to communicate with each other. Accordingly, air flows through the exhaust holes 121, and cools the components stored in the case 10.

The third casing 130 may be bent from a portion of the second casing 120, and support the upper bracket 40, together with a boss 513 described hereinafter. The third casing 130 may be disposed at at least a portion of sides of the first casing 110.

A first upper plate 41 forming a bottom surface of the upper bracket 40 may be mounted on an upper surface of the third casing 130, and the first upper plate 41 and the third casing 130 may be coupled to each other by a coupling tool, such as a bolt, for example.

The cover plate 20 may be coupled to an upper end of the case 10, and an object to be heated may be placed on an upper surface of the cover plate 20. The cover plate 20 may close the upper portion of the case 10, which is open, to protect the components stored in the case 10.

An object to be heated is placed on the upper surface of the cover plate 20, and a magnetic field generated in the heater 30 passes through the cover plate 20 and reaches the object to be heated. The cover plate 20, for example, may be made of a material including ceramics; however, embodiments are not limited thereto.

An input interface that receives an input from a user may be disposed on the upper surface of the cover plate 20. The input interface may be installed in a specific area of the upper surface of the cover plate 20 and display a specific image.

The input interface may receive a touch input from the user, and the electric range may operate based on the received touch input. For example, as a module for inputting heating intensity or heating time, for example, desired by the user, the input interface may be embodied as a physical button or a touch panel, for example. For example, the input interface may be a thin-film-transistor liquid-crystal display (TFT LCD); however, embodiments are not limited thereto.

The control board 90 that inputs an operation instruction to the electric range may be disposed under the cover plate 20. The control board 90 may be provided with a plurality of key switches, and the user may input an instruction to the control board 90 through a key switch to control an operation of the electric range. The control board 90 may be mounted in a control board bracket 91, and the control board bracket 91 may be mounted on the first casing 110.

An upper surface of the control board 90 may closely contact a lower surface of the cover plate 20. In this case, the control board 90 may be disposed in a position corresponding to a position of the input interface.

The control board 90 and the input interface may connect to each other based on a capacitive touch input. As the user inputs a control instruction to the input interface, the control instruction may be input to the control board 90.

A display that displays a drive state of the electric range may be disposed in a specific area of the upper surface of the cover plate 20. More specifically, a light display area may be formed on the upper surface of the cover plate 20. A light source unit 95 may be disposed under the cover plate 20, and light irradiated from the light source unit 95 may be delivered to the user through the light display area. In this case, the light display area and the light source unit 95 may be disposed in mutually corresponding positions. When a plurality of light source units 95 is provided, a number of the light display areas disposed on the upper surface of the cover plate 20 may be the same as a number of the light source units 95.

A plurality of heaters 30 may be disposed under the cover plate 20 and heat an object to be heated. Referring to FIGS. 3 and 4, the electric range may include first, second, and third heaters 30. The first heater 30 may be disposed on a first side, that is, a right side, of the electric range, and may be a high-output heater. The second and third heaters 30 may be disposed on a second side, that is, a left side, of the electric range, and may be a low-output heater. The second and third heaters 30 may be adjacent to each other in a frontward-rearward direction on the left side of the electric range.

As mentioned above, the heater 30 may be based on induction heating. In another embodiment, a portion of the plurality of heaters 30 may be based on induction heating, and a remaining portion may be based on electric resistance heating. That is, an electric range according to another embodiment may be embodied as a highlight heating apparatus or a hybrid electric range. Hereafter, embodiments are described with reference to an electric range in which a plurality of heaters 30 is all based on induction heating.

A temperature sensor 60 senses a temperature of the cover plate 20. A temperature sensed by the temperature sensor 60 may be used to estimate a temperature of the heater 30. The temperature sensor 60 may be disposed in a central portion of the heater 30. The temperature sensor 60 may be electrically connected to the printed circuit board 70 disposed under the upper bracket 40 through an electric wire.

The electric range may include a sensor bracket 61 that mounts the temperature sensor 60 in the central portion of the heater 30. The sensor bracket 61 may be mounted in the central portion of the heater 30, and the temperature sensor 60 may be mounted in the sensor bracket 61.

The heater 30 may be mounted on the upper bracket 40. In the embodiment of FIGS. 3 and 4, two upper brackets 40 may be included in the electric range. The upper bracket 40 disposed on the first side of the electric range may support the high-output heater 30, and the upper bracket 40 disposed on the second side of the electric range may support the low-output heater 30.

The number of the heaters 30 and the number of the upper brackets 40 are not limited. When a plurality of heaters 30 is provided, any number of the upper brackets 40 that supports the heaters 30 may be provided if necessary.

The heater 30 includes the working coil 31 and a core frame 32, and a ferrite core may be disposed on a lower surface of the core frame 32. The working coil 31 may be spirally wound around an upper surface of the core frame 32. As high-frequency power is supplied to the working coil 31, a magnetic field is formed around the ferrite core, and the formed magnetic field may induce eddy current to an object to be heated.

The upper bracket 40 may be disposed under the heater 30 and support the heater 30. The upper bracket 40 may be referred to as a "first bracket". The upper bracket 40 may be made of aluminum, for example; however, embodiments are not limited thereto.

The upper bracket 40 may include the first upper plate 41 and a second upper plate 42. The first upper plate 41 may form a bottom surface of the upper bracket 40, and the heater 30 may be mounted on the first upper plate 41. The first upper plate 41 may be provided to vertically cover the printed circuit board 70 disposed under the first upper plate 41. When a plurality of upper brackets 40 is provided, a single first upper plate 41 or a plurality of first upper plates 41 coupled may cover the printed circuit board 70, depending on a surface area of the printed circuit board 70.

The first upper plate 41 may block an electromagnetic field or an electromagnetic wave generated from the heater 30 from reaching the printed circuit board 70 and the electronic elements installed in the printed circuit board 70. That is, the upper bracket 40 may help to improve electromagnetic compatibility (EMC) and electromagnetic Interference (EMI) of the printed circuit board 70.

The second upper plate 42 may be formed in such a way that it is bent from the first upper plate 41. In this case, the second upper plate 42 may be bent in an upward-downward direction of the electric range. That is, the second upper plate 42 may be formed in a way that it is bent from an edge of the first upper plate 41 vertically. The second upper plate 42 may be disposed on at least one side of the first upper plate 41 entirely formed into a rectangle.

The second upper plate 42 may improve an entire rigidity of the upper bracket 40. That is, the second upper plate 42 may be formed in such a way that it is bent from the first upper plate 41 to suppress bending of the plate-shaped first upper plate 41 bend or damage caused by a weight of built-in components including the heater 30 or an external force.

The light source unit 95 may be disposed at the upper bracket 40. For example, the light source unit 95 may be disposed on the printed circuit board 70 disposed under the upper bracket 40, and the upper bracket 40 may have an opening that is disposed in a position corresponding to a position of the light source unit 95. As another example, the light source unit 95 may be disposed on the upper bracket 40 and electrically connect to the printed circuit board 70 thereunder.

As described above, a light display area may be formed in a portion of the cover plate 20, which corresponds to the portion of the light source unit 95. The light source unit 95, for example, may be provided in such a way that a plurality of LEDs is arranged in a line. The light source unit 95 may light up as the heater 30 operates to inform the user whether the heater 30 operates. Alternatively, the light source unit 95 may change a shape, or color, for example, of light of the plurality of LEDs to inform the user about an operation state of the electric range.

A number of the light source units 95 may be determined properly depending on a number of the heaters 30. FIGS. 3 and 4 show three light source units 95 provided for three heaters 30. However, the number of the light source units 95 is not limited thereto.

The base bracket 50 may be referred to as a "second bracket". The base bracket 50 may be disposed under the upper bracket 40, and the printed circuit board 70 may be mounted on the base bracket 50.

The base bracket 50 may include a bottom plate 51a, 51b and a lateral plate 52. The bottom plate 51a, 51b forms a bottom surface of the base bracket 50, and the printed circuit board 70 may be mounted on an upper surface of a portion 51a of the bottom plate. The boss 513 may be formed in the bottom plate 51b. The boss 513 may support the upper bracket 40, together with the third casing 130 described above.

The bottom plate 51a of the base bracket 50 may be formed on the right side, that is, a first side, of the case 10. The bottom plate 51a of the base bracket 50 may be disposed under the upper bracket 40 supporting the first heater 30. That is, the bottom plate 51a of the base bracket 50 may be disposed under a right upper bracket 40.

The bottom plate 51b of the base bracket 50 may be formed on the left side, that is, a second side, of the case 10. The boss 513 may be formed in the bottom plate 51b of the base bracket 50, and support a portion of the edge of a left upper bracket 40 and the right upper bracket 40.

The lateral plate 52 may be formed in such a way that it is bent from the bottom plate 51a, 51b. The lateral plate 52 may bent in the upward-downward direction of the electric range. The lateral plate 52 may be bent from an edge of the bottom plate 51 vertically. The lateral plate 52 may be disposed on each side of the bottom plate 51 entirely formed into a rectangle.

The lateral plate 52 may improve an entire rigidity of the base bracket 50. That is, the lateral plate 51 may be formed in such a way that it is bent from the bottom plate 51 to suppress bending of the plate-shaped bottom plate 51 or damage caused by a weight of built-in components, such as a circuit board, for example, or an external force.

The printed circuit board 70 may constitute a controller, receive power from an external power source, and communicate with an external device in a wired or wireless manner. The printed circuit board 70 may be electrically connected to the control board 90, and receive instructions, input by the user, from the control board 90. The printed circuit board 70 may electrically connect to the light source unit 95 and the working coil 31 to control their operations.

A plurality of electronic elements may be installed in the printed circuit board 70. The plurality of electronic elements may include a drive circuit. The drive circuit may drive the heater 30.

The heat sink 70 may be mounted on the printed circuit board 70. For example, the heat sink 71 may be formed into a cuboid having a trapezoid-shaped front surface and a trapezoid-shaped rear surface, that is, a trapezoidal prism. The heat sink 71 may reduce heat in the case 10, in particular, heat generated by a portion of the electronic elements installed in the printed circuit board 70. Additionally, the heat sink 71 may protect the components stored in the case 10.

The heat sink 71 may have at least one heat dissipation member or fin. The at least one heat dissipation fin may help to improve cooling efficiency.

An air blowing fan 80 may be mounted on the base bracket 50, and allow external air cooling the case 10 to flow into the case 10. Referring to FIG. 4, a first penetration hole 511 may be formed in a specific area, for example, a rear-side area, of the base bracket 50, and the air blowing fan 80 may be disposed on the first penetration hole 511. Additionally, the first penetration hole 511 may be disposed on a first vent 111a. Accordingly, external air may flow into the air blowing fan 80 through the first vent 111a and the first penetration hole 511, and the air having flown into the air blowing fan 80 may be forced to flow out of an outlet of the air blowing fan 80.

Air provided by the air blowing fan 80 may flow to the printed circuit board 70. The air blowing fan 80 may be spaced from the heat sink 71 at a certain or predetermined interval, and a portion of the air discharged from the air blowing fan 80 may be supplied to the heat sink 71. A remaining portion of the air discharged from the air blowing fan 80 may be supplied to an area outside of the heat sink 71.

An air guide 85 may guide air discharged from the air blowing fan 80. The air guide 85 may be mounted on the printed circuit board 70 in such a way that it surrounds the heat sink 71. Thus, the air guide 85 may deliver the air discharge from the air blowing fan 80 to the heat sink 71.

A first side, for example, a rear side, of the air guide 85 may be connected to an outlet of the air blowing fan 80, and a second side, for example, a front side, of the air guide 85 may be connected to a front of the base bracket 50. In this case, a second penetration hole 512 may be formed on a front side of the base bracket 50, and disposed on a second vent 111b. Thus, air having cooled the heat sink 71 may flow to the second side of the air guide 85 and then be discharged out of the case 10 through the second penetration hole 512 and the second vent 111b.

Figure 7:
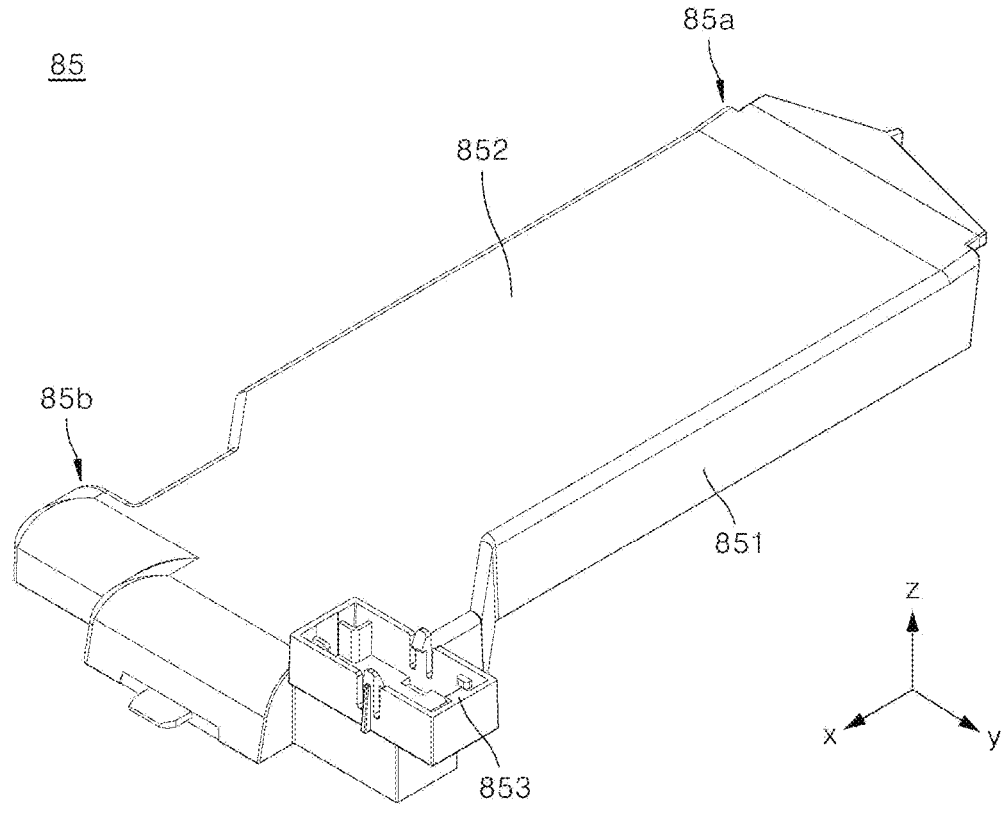
FIG. 7 is a perspective view of an air guide according to an embodiment, viewed from above.
Figure 8:
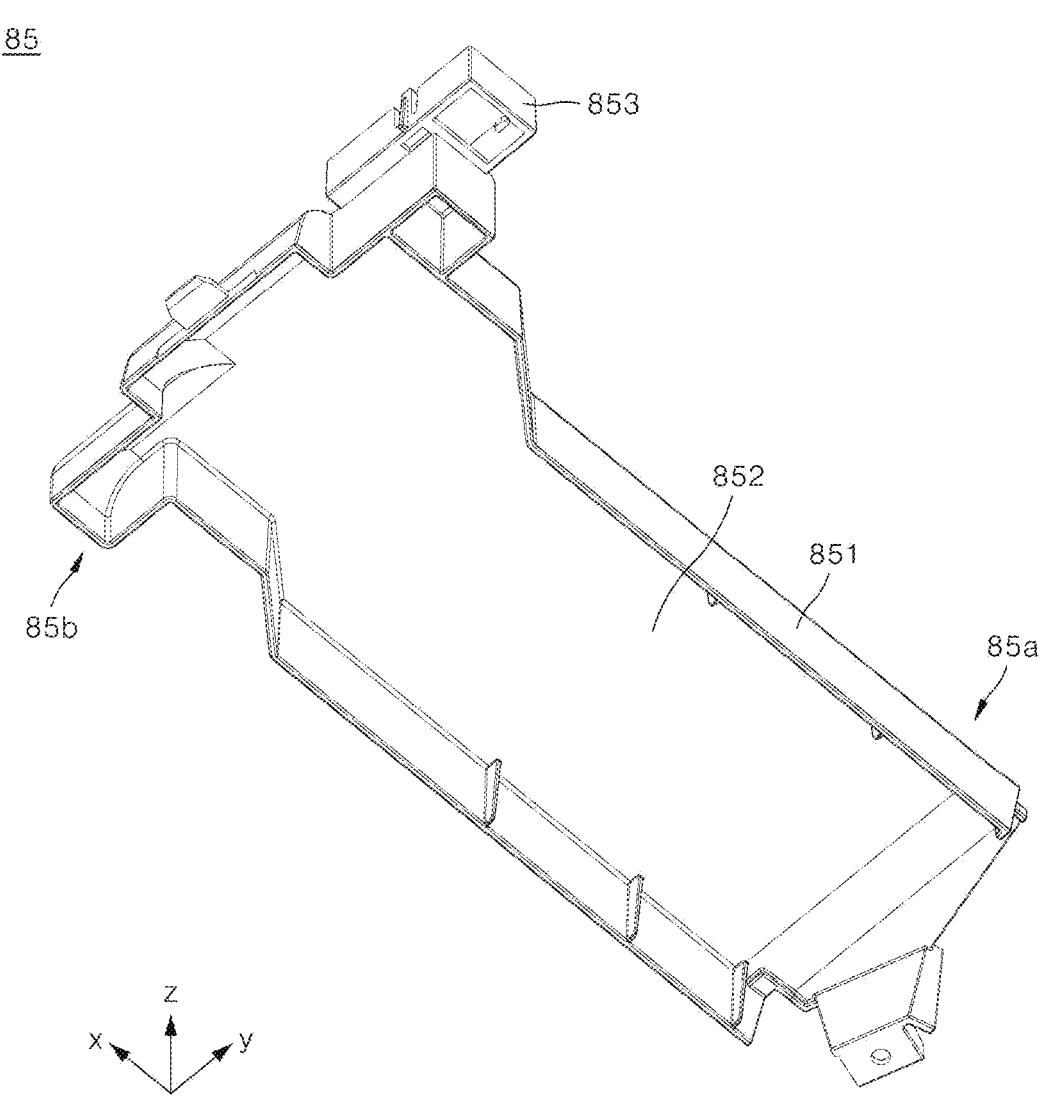
FIG. 8 is a perspective view of the air guide of FIG. 7, viewed from below.
Figure 9:
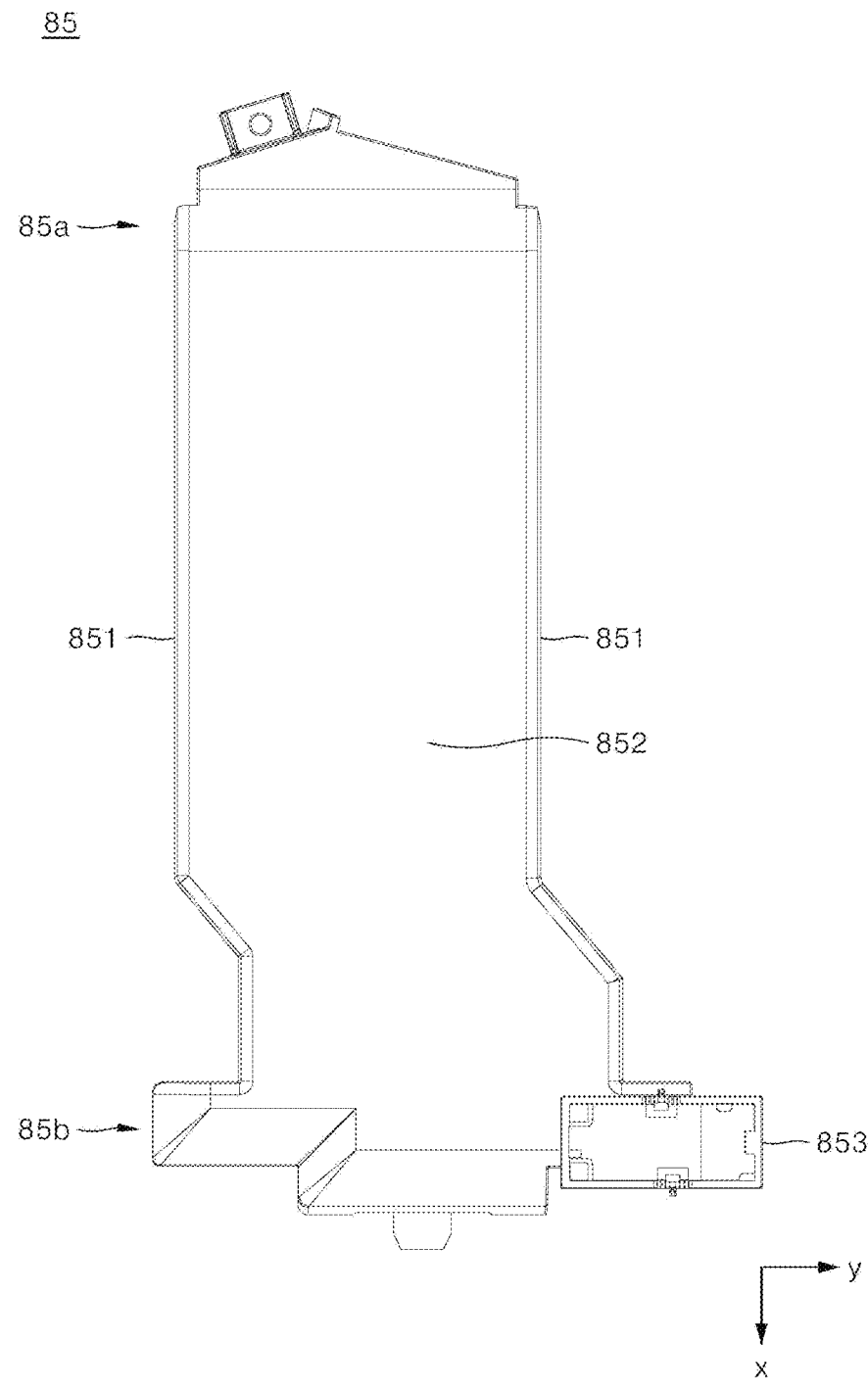
FIG. 9 is a plan view of the air guide of FIG. 7.

Hereafter, a shape of the air guide 85 is described with further reference to FIGS. 7 to 9.

FIG. 7 is a perspective view of an air guide according to an embodiment, viewed from above. FIG. 8 is a perspective view of the air guide of FIG. 7, viewed from below. FIG. 9 is a plan view of the air guide of FIG. 7.

The air guide 85 may be disposed in such a way that it communicates with the air blowing fan 80 and surrounds the heat sink 71. The air guide 85 may provide a flow path of air cooling the heat sink 71.

A first side 85a of the air guide 85 may communicate with the air blowing fan 80, and guide air such that the air flows in a lateral direction of the base bracket 50. In this case, a rear end of the heat sink 71 may connect to the first side 85a of the air guide 85. At the first side 85a of the air guide 85, air may flow in the frontward-rearward direction of the electric range. Air having flown into the first side 85a of the air guide 85 may flow to the heat sink 71 and cool the heat sink 71.

The second side 85b of the air guide 85 may bend in the upward-downward direction of the base bracket 50 and guide air such that the air is discharged out of the electric range. The second side 85b of the air guide 85 may face in a downward direction of the electric range and change a flow direction of air having flown into the air guide 85.

The air guide 85 may be detachably coupled to the base bracket 50. For example, the first side 85a of the air guide 85, which is adjacent to the air blowing fan 80, may be coupled to the base bracket 50 by a coupling tool, such as a screw bolt, for example, and the second side 85b of the air guide 85, through which air is discharged, may be shape-fitted to the based bracket 50.

The air guide 85 may include a lateral wall 851 and an upper wall 852. A space in which air discharged from the air blowing fan 80 flows may be formed by the lateral wall 851 and the upper wall 852. A pair of lateral walls 851 may be provided and the lateral walls may be disposed on both sides of the heat sink 71. The upper wall 852 may be coupled to an upper end of the pair of lateral walls 851 and cover the heat sink 71.

The space formed by the lateral walls 851 and the upper wall 852 may be a flow space in which the air discharged from the air blowing fan 80 flows, and the heat sink 71 may be disposed in the flow space. Accordingly, the heat sink 71 may be cooled by air flowing in the flow space of the air guide 85.

The air guide 85 may be provided with a communication substrate mounting part or mount 853. The communication substrate mount 853 may be disposed in a portion that protrudes from an end of the upper bracket 40 laterally in a state in which the air guide 85 is mounted on the electric range. A wireless communicator mounted on the communication substrate mount 853 may be disposed not to vertically overlap the upper bracket 40, which may be made of metal. Accordingly, the wireless communicator may smoothly communicate with an external device without being interfered with by jamming of the upper bracket 40 made of metal.

Hereafter, the heat sink 71 disposed in the air guide 85 is described with reference to FIGS. 10 to 18.

Figure 10:
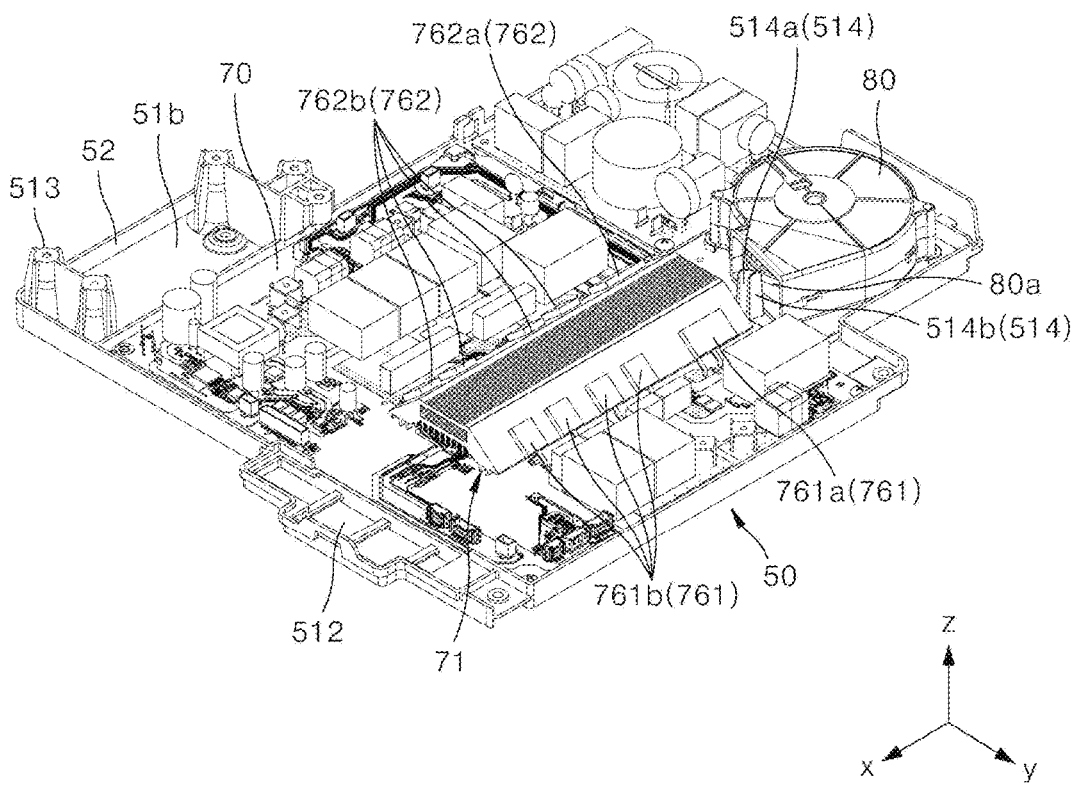
FIG. 10 is a perspective view showing that a printed circuit board provided with a heat sink is installed in a base bracket, according to an embodiment.
Figure 11:
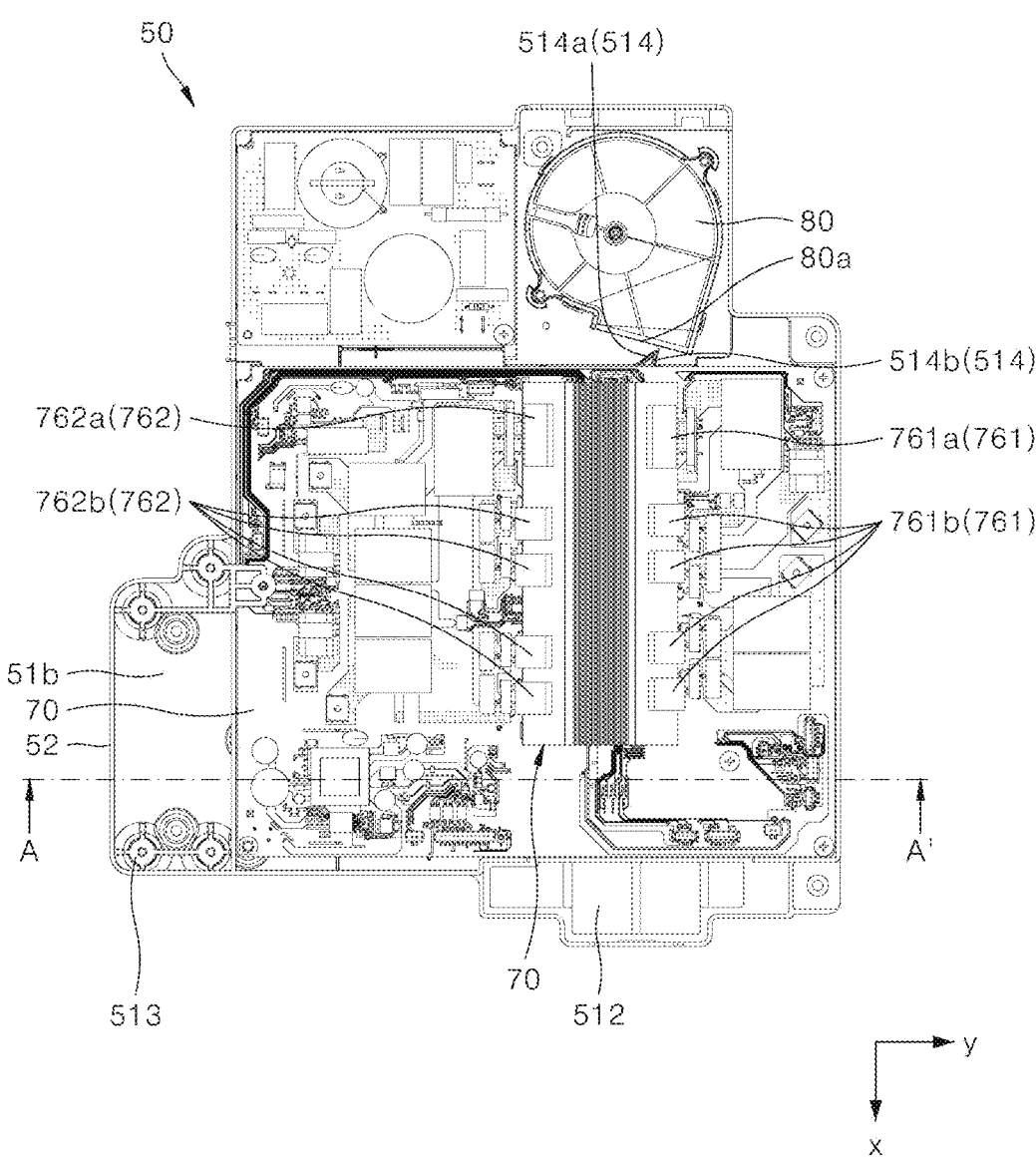
FIG. 11 is a plan view of the components of FIG. 10.
Figure 12:
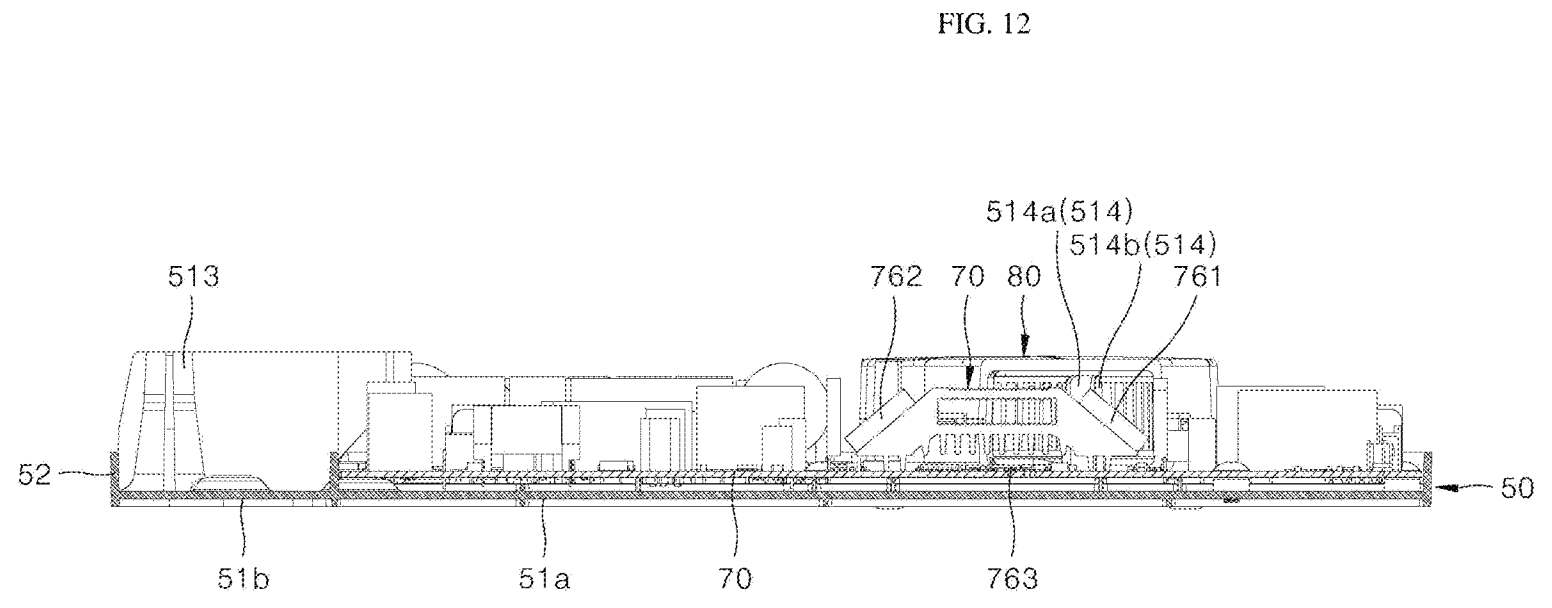

FIG. 10 is a perspective view showing that a printed circuit board provided with a heat sink is installed in a base bracket, according to an embodiment. FIG. 11 is a plan view of the components of FIG. 10. FIG. 12 is a cross-sectional view of the components of FIG. 10.

Referring to FIGS. 4, and 10 to 12, the printed circuit board 70 may be mounted on the bottom plate 51a of the base bracket 50, and the heat sink 71 may be mounted on the printed circuit board 70. The air blowing fan 80 may be spaced from the rear side, that is, a third side, of the heat sink 71 and mounted on the base bracket 50. A lengthwise direction, that is, the frontward-rearward direction, of the heat sink 71 may be parallel with a direction in which air passing through the air guide 85 flows. Accordingly, a contact surface area and time for contact between the heat sink 71 and air forced to flow may increase, thereby enhance cooling efficiency of the heat sink.

An outlet 80a of the air blowing fan 80 may be disposed in a rearward direction of the heat sink 71. Accordingly, air discharged from the outlet 80a of the air blowing fan 80 may flow in the rearward direction of the heat sink 71.

A plurality of electronic elements may be disposed on the printed circuit board 70. The plurality of electronic elements may include a drive circuit that controls driving of the plurality of heaters 30. That is, according to embodiments, a single drive circuit and a single heat sink 71 may be used to control the plurality of heaters 30.

The plurality of electronic elements may be disposed on the right side, that is, the first side, the left side, that is, the second side, and the lower side of the heat sink 71. Additionally, air discharged from the air blowing fan 80 may be supplied to an electronic element on the right side of the heat sink 72, an electronic element on the left side of the heat sink 71, and an electronic element 763 on the lower side of the heat sink 71, through the air guide 85 and a vane 514.

The drive circuit may include a rectifier, a DC link capacitor, an inverter, and a resonance capacitor. The rectifier may be comprised of a rectifying element 761a, 762a and convert AC power supplied from an external power source into DC power. For example, the rectifying element 761a, 762a may include a bridge diode.

The DC link capacitor may receive DC power from the rectifying element 761a, 762a and reduce ripple in the supplied DC power. The DC link capacitor may be, for example, a smoothing capacitor. DC voltage which is rectified by the rectifying element 761a, 762a and the ripple of which is reduced by the DC link capacitor may be supplied to the inverter.

The inverter may include a plurality of inverter switching elements 761b, 762b. The inverter switching elements 761b, 762b may be alternately turned on or turned off by a switching signal to convert DC power to high-frequency alternating current, that is, resonance current. The converted high-frequency alternating current may be supplied to the working coil 31. For example, the inverter switching element 761b, 762b may include an insulated-gate bipolar transistor (IGBT).

A plurality of resonance capacitors may connect respectively to the plurality of inverter switching elements 761b, 762b in parallel. As voltage is supplied based on a switching operation of the inverter, the resonance capacitor starts to resonance. Accordingly, current flowing in the working coil 31 increases, and eddy current is induced.

A portion 761, 762 of the plurality of electronic elements may be attached to an outer surface of the heat sink 71. That is, a portion 761, 762 of the electronic elements may be attached to outer slanted surfaces (see 720a, 730a, FIG. 13, for example, of the heat sink 71. For example, the portion 761, 762 of the electronic elements may be the rectifying elements 761a, 762a and the inverter switching elements 761b, 762b. However, the portion 761, 762 of the electronic elements are not limited to the rectifying elements 761a, 762a and the inverter switching elements 761b, 762b, and various types of electronic elements, in addition to the rectifying elements 761*a*, 762*a* and the inverter switching elements 761*b*, 762*b*, may be attached to the outer slanted surfaces 720*a*, 730*a* of the heat sink 71. Hereafter, the rectifying elements 761*a*, 762*a* and the inverter switching elements 761*b*, 762*b* attached to the heat sink 71 are described as an example, for convenience of description.

Though not illustrated, a thermal pad may be disposed between the rectifying element 761*a*, 762*a* and the outer slanted surfaces 720*a*, 730*a* of the heat sink 71, and a thermal pad may also be disposed between the inverter switching element 761*b*, 762*b* and the outer slanted surfaces 720*a*, 730*a* of the heat sink 71.

The heat sink 71 may be formed into a trapezoidal prism, and a temperature of both side portions (see 720, 730, FIG. 13, for example) of the heat sink 71 may differ because of heat generated by the portion 761, 762 of the electronic elements. To minimize a difference in the temperature between the outer slanted surfaces 720*a*, 730*a*, a vane 514 may be formed, and a mounting structure of the air blowing fan 80 may be set. The mounting structure of the air blowing fan 80 may include a direction of rotation of the air blowing fan 80, left-side and right-side distances of the air blowing fan 80 with respect to the heat sink 71, and an angle of the outlet 80*a* of the air blowing fan 80.

The vane 514 may be formed between the outlet 80*a* of the air blowing fan 80 and a rear side of the heat sink 71. A flow path of air discharged from the air blowing fan 80 may be divided into two by the vane 514 disposed near an inlet of the air guide 85, and the vane 514 may direct a flow direction of the air guided into the flow space in the air guide 85.

The vane 514 may include first and second vanes 514*a*, 514*b*. The first and second vanes 514*a*, 514*b* may protrude toward the heat sink 71, and be spaced further toward a direction in which the heat sink 71 is disposed. That is, the first vane 514*a* may protrude toward the heat sink 71, and the second vane 514*b* may be separated from the first vane 514*a* and protrude toward the heat sink 71. A distance between the first vane 514*a* and the second vane 514*b* may increase toward the heat sink 71. In the structure, air forced to flow may be divided in two flow portions by the first and second vanes 514*a*, 514*b*.

Referring to FIGS. 10 and 11, the vane 514 may be formed at the base bracket 50; however, embodiments are not limited thereto. In another embodiment, the vane 514 may be integrated with the air guide 85 at the inlet (formed at the first side 85*a*) of the air guide 85. In yet another embodiment, the vane 514 may be integrated into the air blowing fan 80 at the outlet 80*a* of the air blowing fan 80.

A structure for minimizing a difference in temperature between the outer slanted surfaces 720*a*, 730*a* is described hereinafter.

Hereafter, structure of the heat sink 71 is described with reference to FIGS. 13 to 15.

Figure 13:
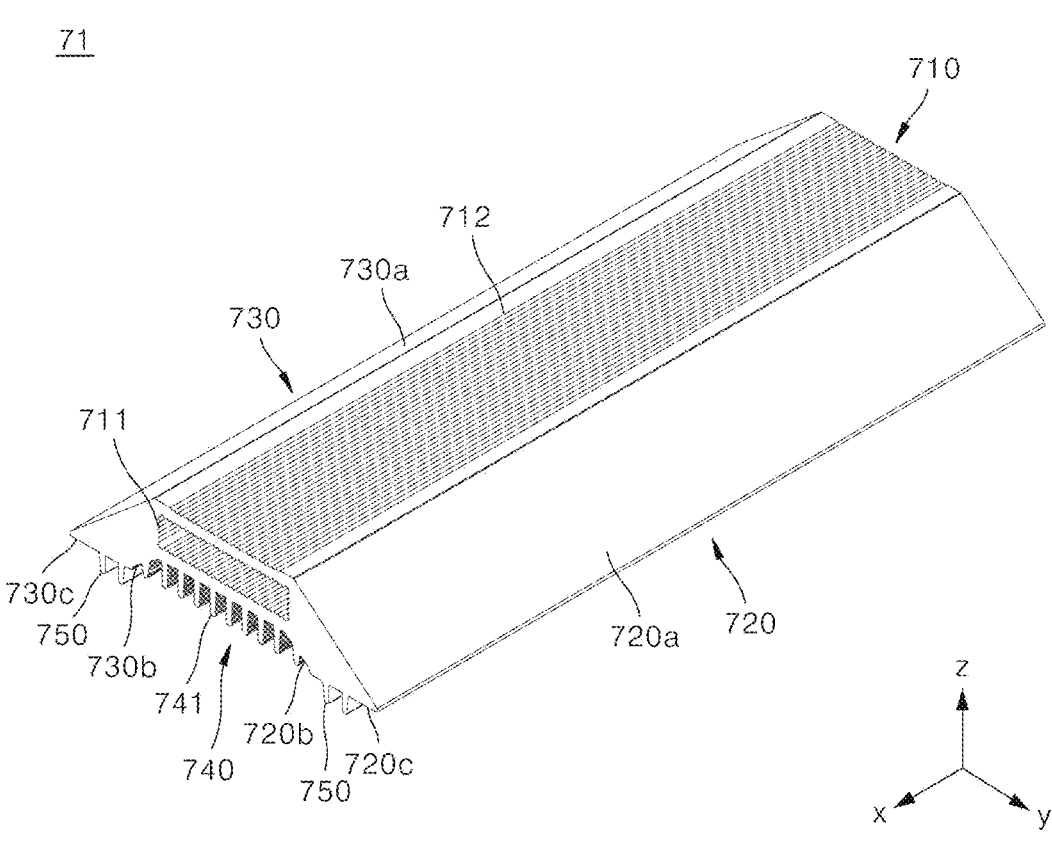
FIG. 13 is a perspective view showing a heat sink according to an embodiment, viewed from above.
Figure 14:
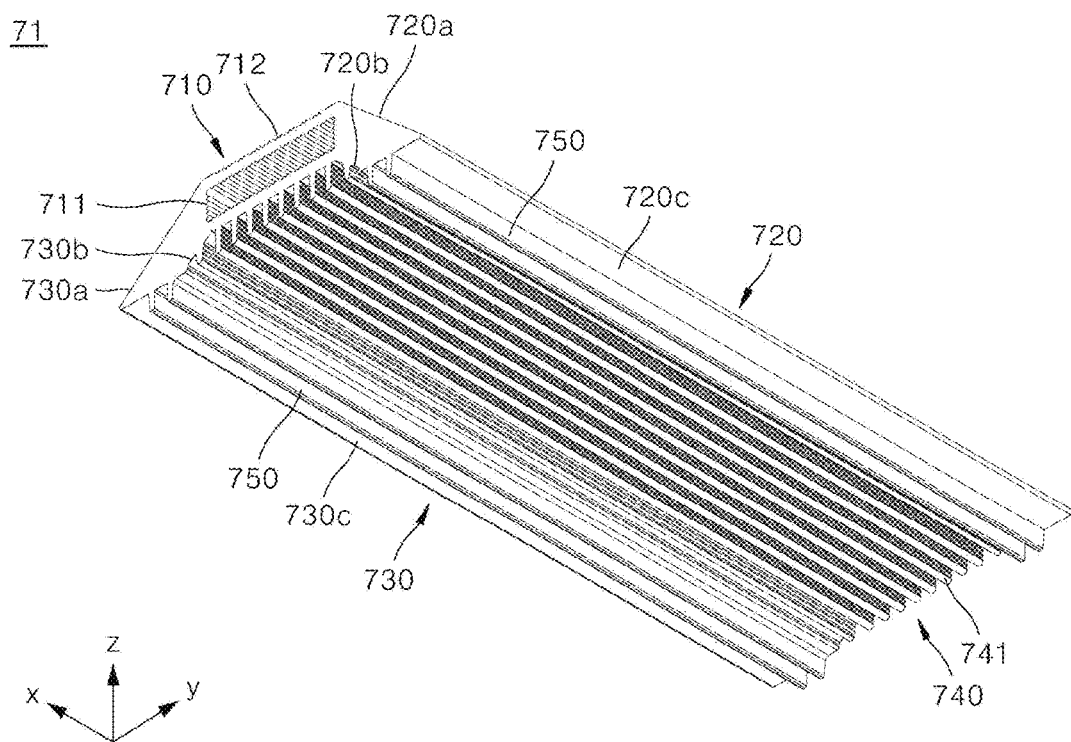
FIG. 14 is a perspective view showing the heat sink of FIG. 13, viewed from below.

FIG. 13 is a perspective view of a heat sink according to an embodiment, viewed from above. FIG. 14 is a perspective view of the heat sink of FIG. 13, viewed from below. FIG. 15 is a cross-sectional view of the heat sink of FIG. 13.

Referring to FIGS. 12 to 15, the heat sink 71 may include a first portion 710, a second portion 720, and a third portion 730 integrally. The first portion 710 may constitute the main body of the heat sink 71. The first portion 710 may be entirely formed into a cuboid.

A first air flow path 711 having a hollow hole may be formed in the first portion 710. The first air flow path 711 may be formed in a way such that it extends in the lengthwise direction, that is, the frontward-rearward direction, of the heat sink 71.

The first air flow path 711 may provide a passage through which air discharged from the air blowing fan 80 flows. That is, a portion of the air discharged from the air blowing fan 80 may flow into a rear side of the first air flow path 711 and then flow out of a front side of the first air flow path 711. As the first air flow path 711 is formed, a contact surface between the heat sink 71 and air may increase. As a result of simulation carried out by the applicant, a height of the first air flow path 711 may be at least 6 mm, considering a shape of the air guide 85, for example.

The second portion 720 may be extended in such a way that it inclines downward from the right side, that is, a first side, of the first portion 710. The second portion 720 may be entirely formed into a triangle pillar. The second portion 720 may include outer slanted surface 720*a*, inner slanted surface 720*b*, and lower surface 720*c*.

The outer slanted surface 720*a* of the second portion 720 may be extended downward from an upper surface of the first portion 710 at a predetermined angle. The inner slanted surface 720*b* of the second portion 720 may be extended downward from a lower surface of the first portion 710 at a predetermined angle. The lower surface 720*c* of the second portion 720 may be extended to a lower end of the outer slanted surface 720*a* and a lower end of the inner slanted surface 720*b* horizontally. Accordingly, the lower surface 720*c* of the second portion 720 may be disposed at a height less than the lower surface of the first portion 710.

The third portion 730 may be extended in such a way that it inclines downward from the left side, that is, a second side, of the first portion 710. The third portion 730 may be entirely formed into a triangle pillar. The third portion 730 may include an outer slanted surface 730*a*, an inner slanted surface 730*b*, and a lower surface 730*c*.

The outer slanted surface 730*a* of the third portion 730 may be extended downward from the upper surface of the first portion 710 at a predetermined angle. The inner slanted surface 730*b* of the third portion 730 may be extended downward from the lower surface of the first portion 710 at a predetermined angle. The lower surface 730*c* of the third portion 730 may be extended to the lower end of the outer slanted surface 730*a* and the lower end of the inner slanted surface 730*b* horizontally. Accordingly, the lower surface 730*c* of the third portion 730 may be disposed at a height less than the lower surface of the first portion 710.

The second portion 720 and the third portion 730 may have a same shape, and be disposed to face each other with respect to the first portion 710. That is, the second portion 720 and the third portion 730 may be symmetric to each other with respect to the first portion 710.

A coupling member 750 may be formed on the lower surfaces of the second and third portions 720, 730 in the lengthwise direction of the heat sink 71. The coupling member 750 may be formed into a plate that protrudes downward from the lower surfaces of the second and third portions 720, 730. The coupling member 750 may be formed to mount the heat sink 71 on the printed circuit board 70. As a result of simulation carried out by the applicant, the second and third portions 720, 730 may have a slant angle of at least 40°, considering the shape of the air guide 85, for example.

A second air flow path 740 may be formed at the heat sink 710. The second air flow path 740 may be formed under the first air flow path 711. The second air flow path 740 may be defined by the lower surface of the first portion 710, the inner slanted surface 720*b* of the second portion 720, and the inner slanted surface 730b of the third portion 730. That is, the lower surface of the first portion 710, the inner slanted surfaces 720b, 730b of the second and third portions 720, 730 may correspond to the walls of the second air flow path 740. Accordingly, the second air flow path 740 may have a trapezoidal prism shape without a lower surface.

The second air flow path 740 may be formed in such a way that it extends in the lengthwise direction of the heat sink 71. The second air flow path 740 may provide a passage through which air discharged from the air blowing fan 80 flows. That is, a portion of the air discharged from the air blowing fan 80 may flow into a rear side of the second air flow path 740 and then flow out of a front side of the second air flow path 740. As the second air flow path 740 is formed, a contact surface between the heat sink 71 and air may increase.

The second air flow path 740 may include a plurality of heat dissipation members or fins 741. Each heat dissipation fin 741 may be a plate that protrudes downward from the wall of the second air flow path 740. The heat dissipation fin 741 may be formed in such a way that it extends in the lengthwise direction of the heat sink 71. As the plurality of heat dissipation fins 741 is formed, a contact surface between the heat sink 71 and air may increase.

The plurality of heat dissipation fins 741 may be spaced from one another at predetermined intervals. For example, the plurality of heat dissipation fins 741 may be spaced at regular intervals. A lower end of the plurality of heat dissipation fins 741 may be respectively spaced from the printed circuit board 70 at a regular interval. That is, the lower end of the plurality of heat dissipation fins 741 may be formed in such a way that the lower end of the plurality of heat dissipation fins 741 respectively contacts a virtual lower surface of the second air flow path 740.

Referring to FIG. 13, the electronic element 763 may be installed in close contact with the printed circuit board 70, and the second air flow path 740 may be disposed on the electronic element 763. In this case, an increasing height of the heat dissipation fins 741 results in an increasing contact surface area between the heat sink 71 and air. In this context, to increase the contact surface area further, the plurality of heat dissipation fins 741 may be formed to have a maximum height to the extent that the plurality of heat dissipation fins 741 does not interfere with the electronic element 763 disposed under the heat sink 71.

The heat sink 71 may further include a plurality of projections 7111, 712, 7411. The plurality of projections 7111, 712, 7411 may be formed to increase a contact surface area between the heat sink 71 and air.

More specifically, the plurality of projections 7111, 712, 7411 may include a first projection 712, a second projection 7111, and a third projection 7411. Though not illustrated, the plurality of projections 7111, 712, 7411 may further include a fourth projection, and a fifth projection.

The first projection 712 may be formed on the upper surface of the first portion 710. The first projection 712 may be formed on the upper surface of the first portion 710 in such a way that it extends in the lengthwise direction of the heat sink 71. Referring to FIG. 15, the first projection 712 may be formed in such a way that it is depressed from the upper surface of the first portion 710.

The second projection 7111 may be formed on the wall of the first air flow path 711. The second projection 7111 may be formed on the wall of the first air flow path 711 in such a way that it extends in the lengthwise direction of the heat sink 71. FIGS. 13 to 15 show that the second projection 7111 is formed on all the walls of the first air flow path 711.

However, the second projection 7111 may be formed only on a portion of the walls of the first air flow path 711.

The third projection 7411 may be formed on the outer surface of the heat dissipation fin 741. FIGS. 13 to 15 show that the third projections 7411 is formed on all of the plurality of heat dissipation fins 741. However, the third projection 7411 may be formed only on a portion of the heat dissipation fins 741.

The fourth projection may be formed on the walls of the second air flow path 740. That is, the fourth projection may be formed on the lower surface of the first portion 710, and the inner slanted surfaces 720b, 730b of the second and third portions 720, 730. The fourth projection may be formed on the walls of the second air flow path 740 in such a way that it extends in the lengthwise direction of the heat sink 71.

The fifth projection may be formed on the outer surface of the coupling member 750 such that it protrudes from the inner slanted surfaces 720b, 730b of the second and third portions 720, 730. The fifth projection may be formed on the outer surface of the coupling member 750 in such a way that it extends in the lengthwise direction of the heat sink 71. The fifth projection may be formed in a portion of the coupling members 750, which is not coupled to the printed circuit board 70.

As described above, a portion 761, 762 of the electronic elements constituting the drive circuit may be attached to the outer surface of the heat sink 71. Hereafter, the shape of the heat sink 71 to which a portion 761, 762 of the electronic elements are attached is described with reference to FIGS. 16 to 18.

Figure 16:
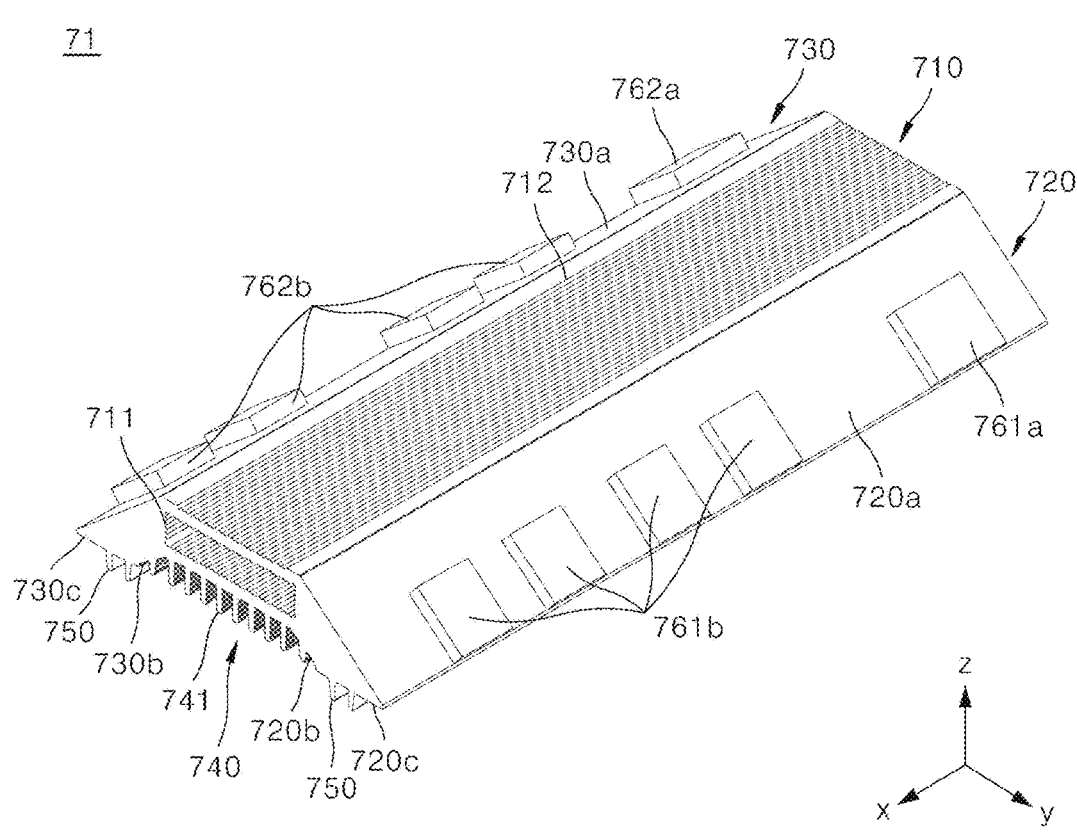
FIG. 16 is a perspective view of the heat sink to which a portion of electronic elements is attached, according to an embodiment.
Figure 17:
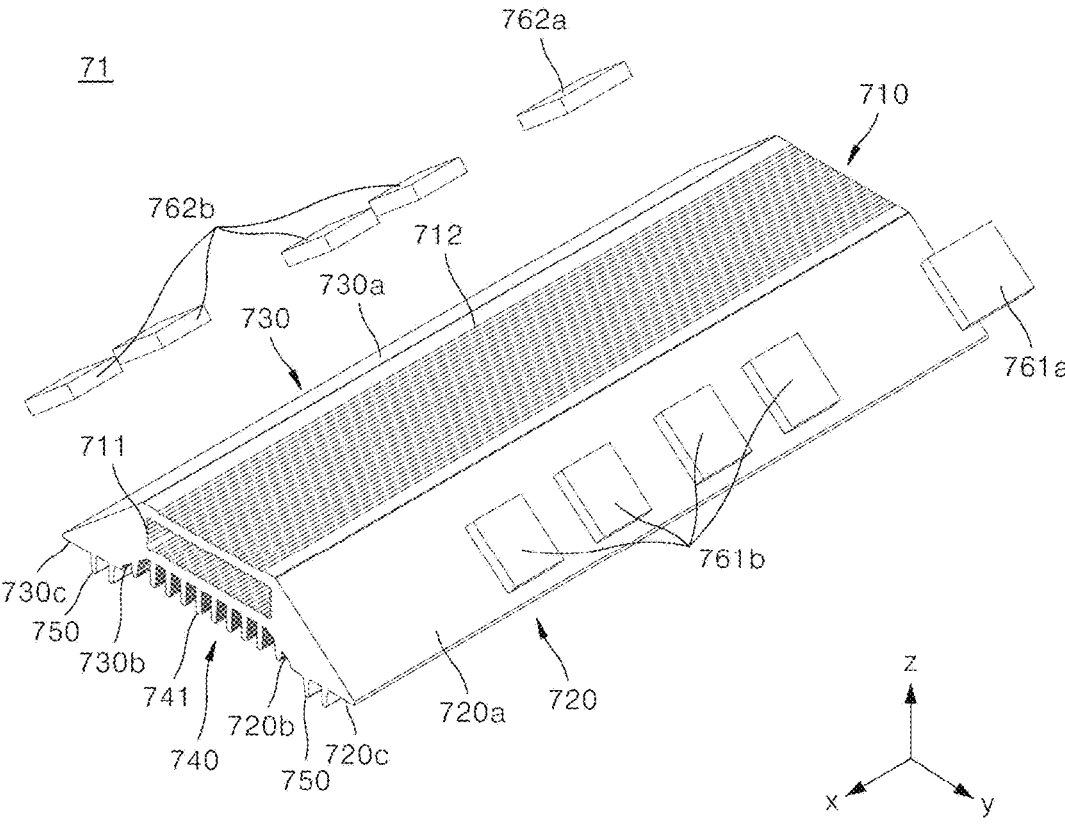
FIG. 17 is an exploded perspective view of the heat sink to which a portion of electronic elements is attached, according to an embodiment.
Figure 18:
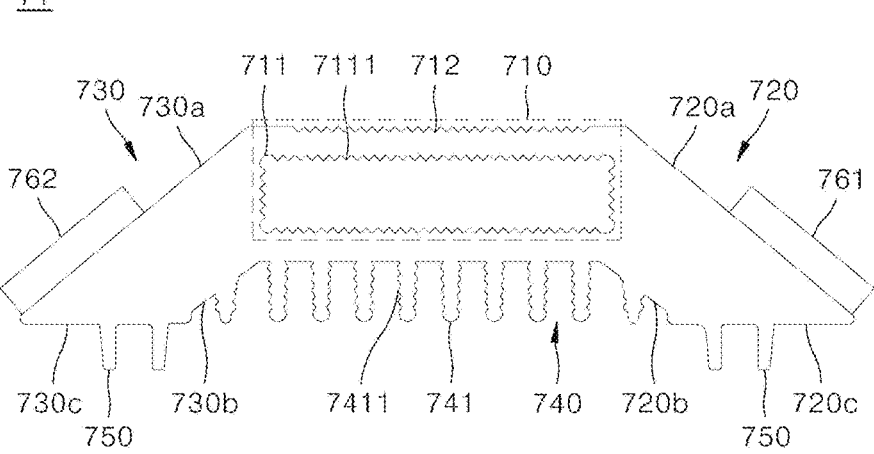
FIG. 18 is a cross-sectional view showing the heat sink to which a portion of electronic elements is attached, according to an embodiment.

FIG. 16 is a perspective view of the heat sink to which a portion of electronic elements is attached, according to an embodiment. FIG. 17 is an exploded perspective view of the heat sink to which a portion electronic elements is attached, according to an embodiment. FIG. 18 is a cross-sectional view of the heat sink to which a portion electronic elements is attached, according to an embodiment.

Referring to FIGS. 16 to 18, a portion of the electronic elements 761, 762 may be attached to the outer slanted surface 720a, 730a of the heat sink 71. More specifically, a portion 761, 762 of the electric elements may be grouped as first electronic element group 761 and second electronic element group 762. The first electronic element group 761 may be attached to the outer slanted surface 720a of the second portion 720 of the heat sink 71. The second electronic element group 762 may be attached to the outer slanted surface 730a of the third portion 730 of the heat sink 71.

The first electronic element group 761 may be an electronic element group for driving a portion of the plurality of heaters 30. A portion of the heaters 30 may be the first heater 30 disposed on the right side, that is, the first side, of the case 10. Hereafter, suppose that a portion of the heaters is the first heater 30.

The first electronic element group 761 may include a first rectifying element or rectifier 761a, and four first inverter switching elements or switches 761b for driving the high-output first heater 30. That is, the first electronic element group 761 may be attached to the slanted surface 720a on the right side of the heat sink 71, and used to drive the first heater 30 disposed on the right side of the electric range.

The second electronic element group 762 may be an electronic element group for driving the remaining portion of the plurality of heaters 30. The remaining portion of the heaters may be the second and third heaters 30 disposed on the left side, that is, the second side, of the case 10.

Hereafter, suppose that the remaining portion of the heaters is the second and third heaters 30.

The second electronic element group 762 may include a second rectifying element or rectifier 762a and four second inverter switching elements or switches 762b for driving the low-output second and third heaters 30. That is, the second electronic element group 762 may be attached to the slanted surface 730a on the left side of the heat sink 71, and used to drive the second and third heaters 30 disposed on the left side of the electric range.

In one embodiment, a position of the outer surface of the heat sink 71, to which a portion 761, 762 of the electronic elements are attached, may be set based on a heat resistant temperature of the electronic elements. More specifically, electronic elements have a heat resistant temperature, and their heat resistant temperature varies depending on the sorts of electronic elements. For example, an IGBT as an inverter switching element 761b, 762b has a heat resistant temperature of 180° C., and a bridge diode as a rectifying element 761a, 761b has a heat resistant temperature of 150° C.

Referring to FIGS. 5, 6, 10 and 11, as the air blowing fan 80 is spaced from the heat sink 71, a portion of the heat sink 71, close to the air blowing fan 80, has a lower temperature than the other portion of the heat sink 71, far from the air blowing fan 80. That is, a rear side of the heat sink 71, close to the air blowing fan 80, has a lower temperature than a front side of the heat sink 71, far from the air blowing fan 80.

To prevent temperature-induced damage to the electronic elements further, in one embodiment, the electronic elements having a low heat resistant temperature may be attached to the portion of the heat sink 71 having a relatively low temperature, and the electronic elements having a high heat resistant temperature may be attached to the portion of the heat sink 71 having a relatively high temperature. That is, a portion 761, 762 of the electronic elements may be attached close to the air blowing fan 80 in the order of lower heat resistant temperature. For example, a bridge diode as a rectifying element 761a, 762a may be attached closer to the air blowing fan 80 than an IGBT as an inverter switching element 761b, 762b.

Hereafter, features of the electric range according to an embodiment will be described with reference to the above description of the drawings.

Figure 15:
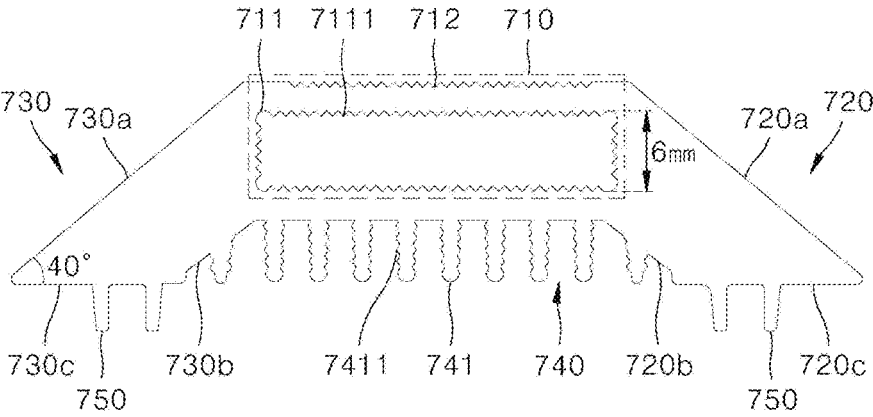
FIG. 15 is a cross-sectional view of the heat sink of FIG. 13.

Referring to FIGS. 13 and 15, first and second air flow paths 711, 740 may be formed inside and outside of the heat sink 71. Additionally, heat dissipation fin 741 may extend downward from a wall of the second air flow path 740. Further, a projection may be formed on walls of the first and second air flow paths 711, 740, an outer surface of the heat dissipation fin 741, and an outer surface of the coupling member 750.

With this structure, a contact surface area between air and the heat sink 71 may increase. Accordingly, a cooling efficiency of the heat sink 71 may increase and a temperature of the heat sink 71 may decrease.

Additionally, a portion 761, 762 of the electronic elements may be attached to the outer slanted surface 720a, 730a of the heat sink 71. Accordingly, because of a decrease in the temperature of the heat sink 71, the cooling efficiency of the portion 761, 762 of the electronic elements may improve. In particular, the air guide 85 and the air blowing fan 80 may be further used in this embodiment, thereby improving the cooling efficiency of the portion 761, 762 of the electronic elements further.

Referring to FIGS. 4, 5, and 10, the heat sink 71 to which the portion 761, 762 of the electronic elements is attached is disposed in the air guide 85, and the air blowing fan 80 supplies air into the air guide 85. Accordingly, the supplied air may flow from a rear side to a front side in the air guide 85.

In this case, the air in the air guide 85 flows in a space between the outer slanted surfaces 720a, 730a of the heat sink 71, and the lateral wall and upper wall 851, 852 of the air guide 85, while flowing to the first and second air flow paths 711, 740 of the heat sink 71. The air flowing in the in-between space contacts the portion 761, 762 of the electronic elements.

Accordingly, a decrease in the temperature of the heat sink 71 results in cooling of the portion 761, 762 of the electronic elements, and the air flowing in the in-between space contacts the portion 761, 762 of the electronic elements to cool the portion 761, 762 of the electronic elements further. That is, the portion 761, 762 of the electronic elements may be cooled not only by a surface temperature of the heat sink 71 but also by the discharged air of the air blowing fan 80 in the air guide 85, thereby ensuring improvement in cooling efficiency. Thus, operational errors of the electric range may be prevented.

As the in-between space has a small surface area, air flowing in the in-between space has a high speed, based on Bernoulli's theorem. Accordingly, the portion 761, 762 of the electronic elements may be cooled quickly by the air flowing at high speed.

Further, vane 514 may be formed, to minimize a difference in the temperature between the outer slanted surfaces 720a, 730a of the heat sink 71. More specifically, a pair of outer slanted surfaces 720a, 730a of the heat sink 71 may be provided. In this case, if not for the vane 514, air of a different flow rate would flow to each of the outer slanted surfaces 720a, 730a of the heat sink 71, due to a direction of rotation of the air blowing fan 80, and a position of the air blowing fan 80 with respect to the heat sink 71, for example. As a result, the cooling efficiency of the portion 761, 762 of the electronic elements attached to the slanted surface 720a, 730a on one side of the heat sink 71 may improve, and the cooling efficiency of the portion 761, 762 of the electronic elements attached to the slanted surface 720a, 730a on the other side of the heat sink 71 may deteriorate.

Under these circumstances, the vane 514 may be disposed to guide air supplied to each of the outer slanted surfaces 720a, 730a of the heat sink 71 such that air flows evenly to each of the outer slanted surfaces 720a, 730a of the heat sink 71. That is, the vane 514 may include first and second vanes 514a, 514b formed between the outlet 80a of the air blowing fan 80 and the rear side of the heat sink 71, and connected at a predetermined angle. Based on a position and shape of the vane 514, air discharged from the air blowing fan 80 is divided into two flow portions, and the two divided flow portions allows air to flow to each of the outer slanted surfaces 720a, 730a of the heat sink 71 uniformly. Thus, the portion 761, 762 of the electronic elements attached to each of the outer slanted surfaces 720a, 730a of the heat sink 71 may all cool efficiently.

Further, to minimize a difference in temperature between the outer slanted surfaces 720a, 730a of the heat sink 71, a mounting structure of the air blowing fan 80 needs to be set efficiently. More specifically, when the air blowing fan 80 rotates clockwise, a larger amount of air may be supplied to the second outer slanted surface 720a of the heat sink 71, and when the air blowing fan 80 rotates counterclockwise, a larger amount of air may be supplied to the third outer slanted surface 730a of the heat sink 71. Additionally, when the air blowing fan 80 is disposed in a rightward or lateral direction of the heat sink 71, a larger amount of air may be supplied to the second outer slanted surface 720*a*, and when the air blowing fan 80 is disposed in the leftward or lateral direction of the heat sink 71, a larger amount of air may be supplied to the third outer slanted surface 730*a*. In this case, the cooling efficiency of the portion 761, 762 of the electronic elements attached to the slanted surface 720*a*, 730*a* on one side of the heat sink 71 may improve, and the cooling efficiency of the portion 761, 762 of the electronic elements attached to the slanted surface 720*a*, 730*a* on the other side of the heat sink 71 may deteriorate.

Under these circumstances, left-side and right-side or lateral distances of the air blowing fan 80 may be set with respect to a direction of rotational of the air blowing fan 80 and the heat sink 71, to minimize a difference in temperature between the second portion 720 and the third portion 730 of the heat sink 71. Thus, the portion 761, 762 of the electronic elements attached to each of the outer slanted surfaces 720*a*, 730*a* of the heat sink 71 may all cool efficiently.

In particular, the outlet 80*a* of the air blowing fan 80 may be disposed at a slant to form a predetermined angle with the rear end of the heat sink 71, depending on the shape of the vane 514. That is, referring to FIG. 11, the position of the first vane 514*a*, and the position of the second vane 514*b* are not symmetric, and an angle between the rear end of the heat sink 71 and the second vane 514*b* may be less than an angle between the rear end of the heat sink 71 and the first vane 514*a*. To uniformize a flow rate of air in the two flow portions divided by the first vane 514*a* and the second vane 514*b*, the outlet 80*a* of the air blowing fan 80 may be disposed at a slant to form a predetermined angle with the rear end of the heat sink 71.

Additionally, the first portion 710 of the heat sink 71, in which the first air flow path 711 is formed, may be disposed between the second portion 720 and the third portion 730 of the heat sink 71. Accordingly, the temperature of the heat sink 71 may be reduced by air having flown to the first air flow path 711, and a difference in temperature between the second and third portions 720, 730 of the heat sink 71 may be minimized by the first portion 710 of the heat sink 71.

Further, hot air contacting the portion 761, 762 of the electronic elements is discharged out of the case 10 through the second side 85*b* of the air guide 85. Thus, the hot air does not contact the portion 761, 762 of the electronic elements again, and the portion 761, 762 of the electronic elements may cool efficiently.

Hereafter, results of a simulation of temperature distribution of the heat sink 71 are described with reference to FIGS. 19 to 33.

In this case, an electric range used for the simulation is provided with three heaters, a single heat sink, and a single air blowing fan. The air blowing fan rotates clockwise at 2,100 rpm for 1,200 hours. Additionally, a vane is not provided, and the outlet of the air blowing fan is disposed in parallel with the rear end of the heat sink. Throughout FIGS. 19 to 33, "Left" denotes a heater on the left, "Right" denotes a heater on the right, and "x %" denotes an operating rate of the heater.

Figure 19:
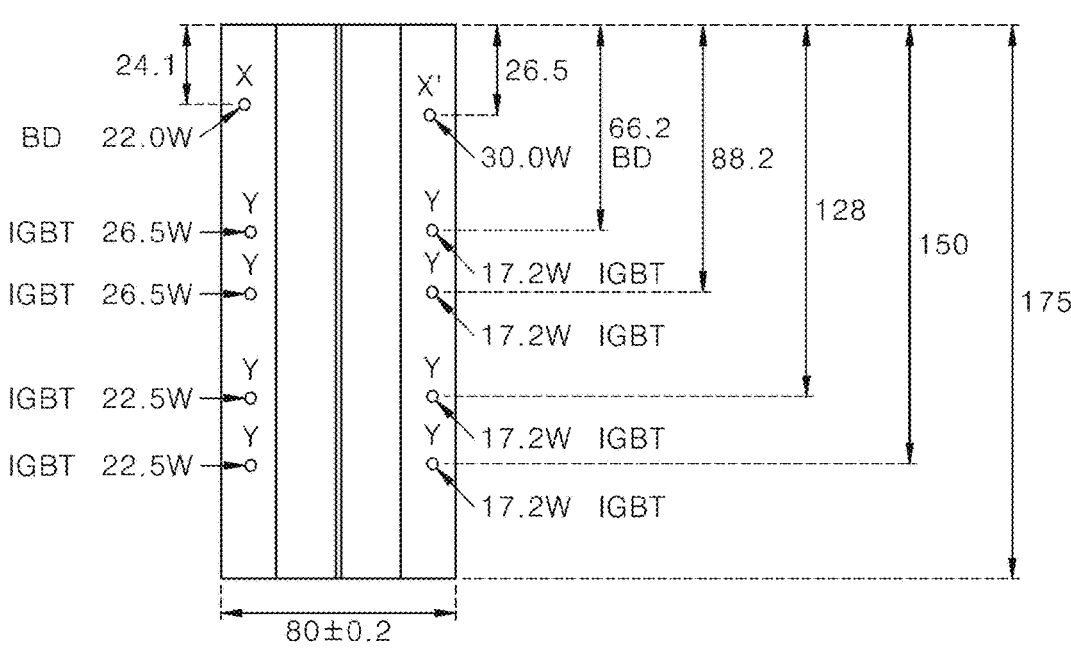

FIG. 19 is a plan view showing the heat sink 71 used for the simulation. Referring to FIG. 19, a single bridge diode and four IGBTs are attached to each of the slanted surfaces on both sides of the heat sink 71. Herein, "W" denotes power consumed by electronic elements. Additionally, the unit of length is mm.

Figure 20:
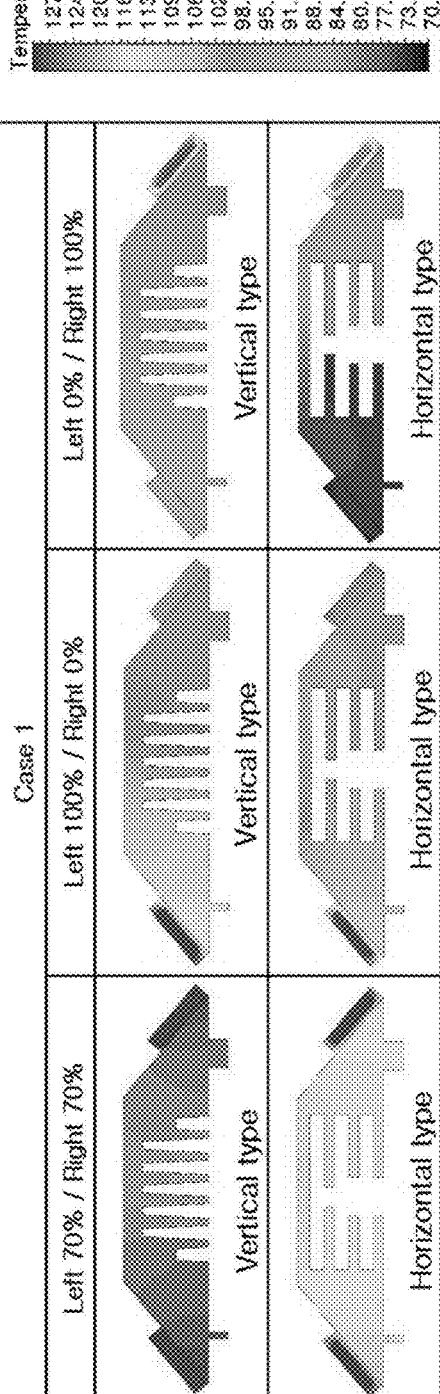

FIGS. 20 and 21 show results of first simulation. In the first simulation, two types of heat sinks are used. That is, referring to FIG. 20, in the first simulation, a vertical heat sink has a heat dissipation member or fin in a lower portion thereof, and a horizontal heat sink has a heat dissipation member or fin on the left and right sides thereof.

Referring to FIGS. 20 and 21, the horizontal heat sink has more excellent cooling efficiency than the vertical heat sink. Additionally, as a distance between the air blowing fan and the heat sink becomes shorter, a cooling efficiency of the heat sink improves further.

Figure 22:
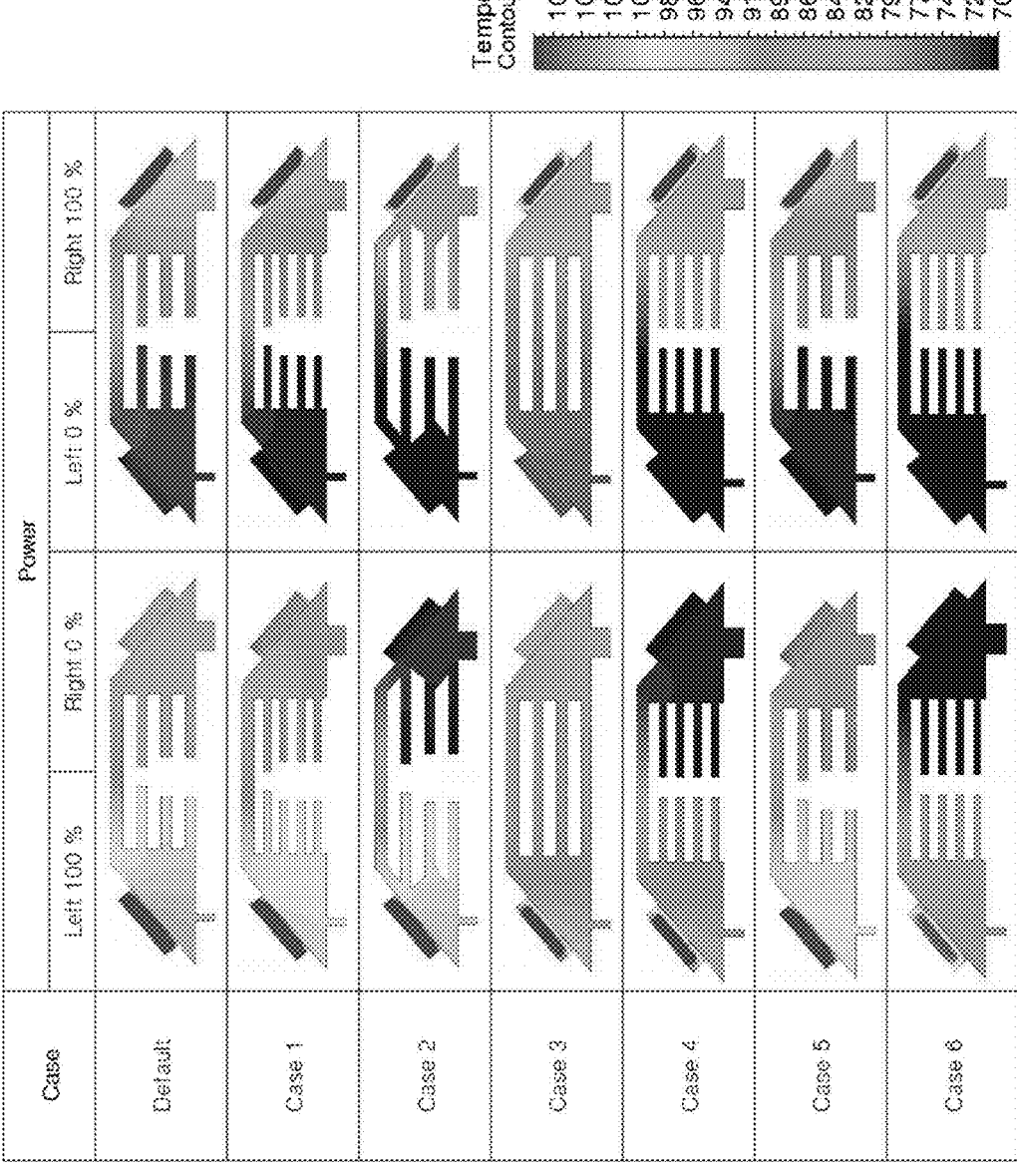

FIGS. 22 and 23 show results of a second simulation. Referring to FIGS. 22 and 23, the second simulation is performed in 7 cases. The 7 cases are described as follows.

Default Case: Horizontal heat sink of first simulation
 Case 1: Add heat dissipation fin in default case
 Case 2: Increase length of heat dissipation fin in default case
 Case 3: Uniformize length of heat dissipation fin in default case
 Case 4: Uniformize length of heat dissipation fin in case 1
 Case 5: Dispose heat sink in air guide in default case
 Case 6: Dispose heat sink in air guide in case 4

Referring to FIGS. 22 and 23, cases 1 to 6 show that a cooling efficiency of the electronic elements improves in the default case. Additionally, case 2 shows that there is a big difference in the temperature on the left and right sides of the heat sink. Further, case 3 shows that as the heat dissipation fins on the left and right sides connect to each other, heat generated by electronic elements attached to any one side is delivered to the other side, and there is a slight difference in the temperature on the left and right sides of the heat sink.

Further, case 4 shows that as lengths of the heat dissipation fins are uniformized, a temperature in the heat sink decreases. Furthermore, cases 5 and 6 show that use of air guide leads to improvement in cooling efficiency of the electronic elements attached to the heat sink.

Figure 24:
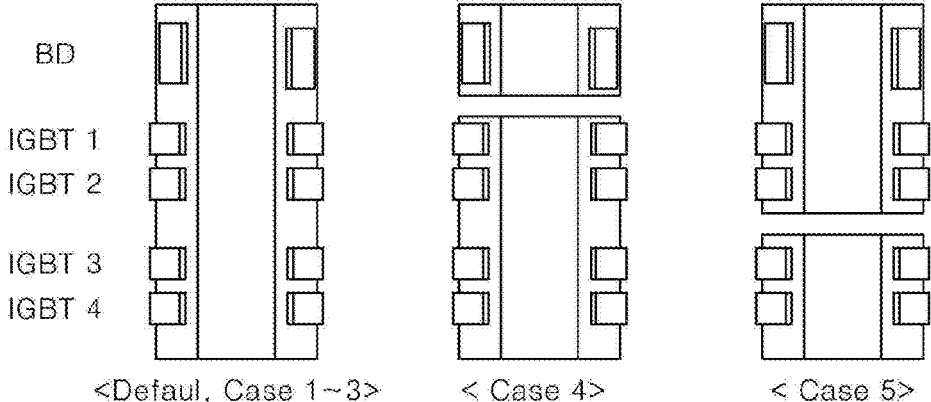
Figure 25:
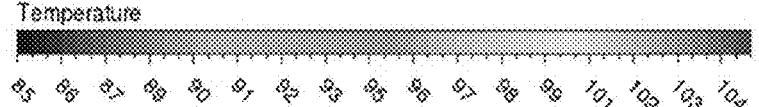
Figure 26:

FIGS. 24 to 27 show results of a third simulation. Referring to FIGS. 24 and 27, the third simulation is performed in 6 cases. The 6 cases are described as follows.

Default Case: Horizontal heat sink of first simulation
 Case 1: Move air blowing fan left by 10 mm in default case
 Case 2: Move air blowing fan right by 10 mm in default case
 Case 3: Move air blowing fan right by 20 mm in default case
 Case 4: Separate upper side of heat sink in default case
 Case 5: Separate lower side of heat sink in default case Referring to 24 and 27, the temperature of the electronic elements in cases 1 and 2 is less than in the default case. Additionally, the temperature of the electronic elements in case 2 is less than in case 1, on average. However, the temperature of the electronic elements in case 3 is greater than in default case.

Further, the temperature of the electronic elements in cases 4 and 5 is less than in the default case at the separated front end, but greater than in the default case at the separated rear end as air flowing into the heat sink is lost at the separated ends.

Figure 28:
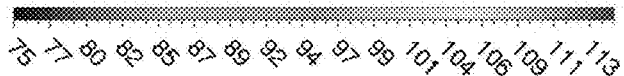

FIGS. 28 and 29 show results of a fourth simulation. Referring to FIGS. 28 and 29, the fourth simulation is performed in 3 cases. The 4 cases are described as follows.

Default Case: Horizontal heat sink of first simulation
 Case 1: Change shape of heat dissipation fin in default case
 Case 2: Form first and second air flow paths, and form heat dissipation fin under second air flow path Referring to FIGS. 28 and 29, the cooling efficiency of the heat sink in cases 1 and 2 is greater than in the default case. Additionally, an order of greater cooling efficiency of the heat sink is Case 2>Case 1>Default.

Figure 30:
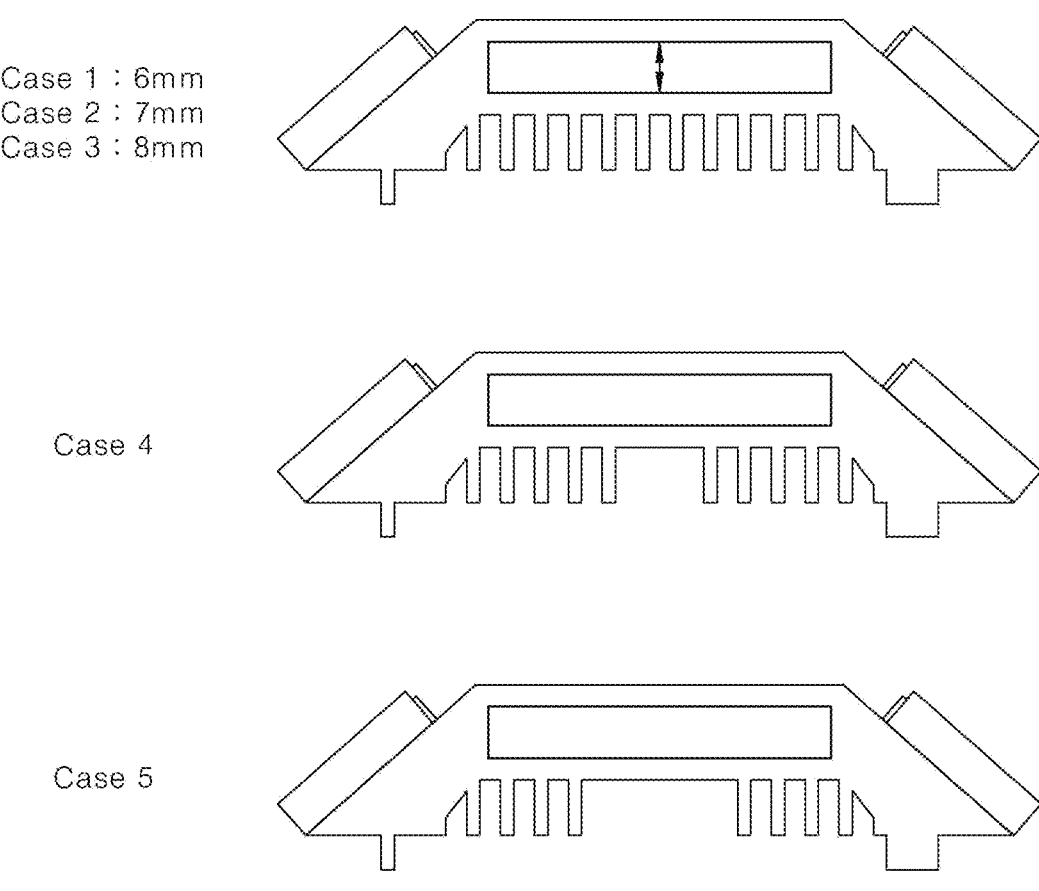
Figure 31:
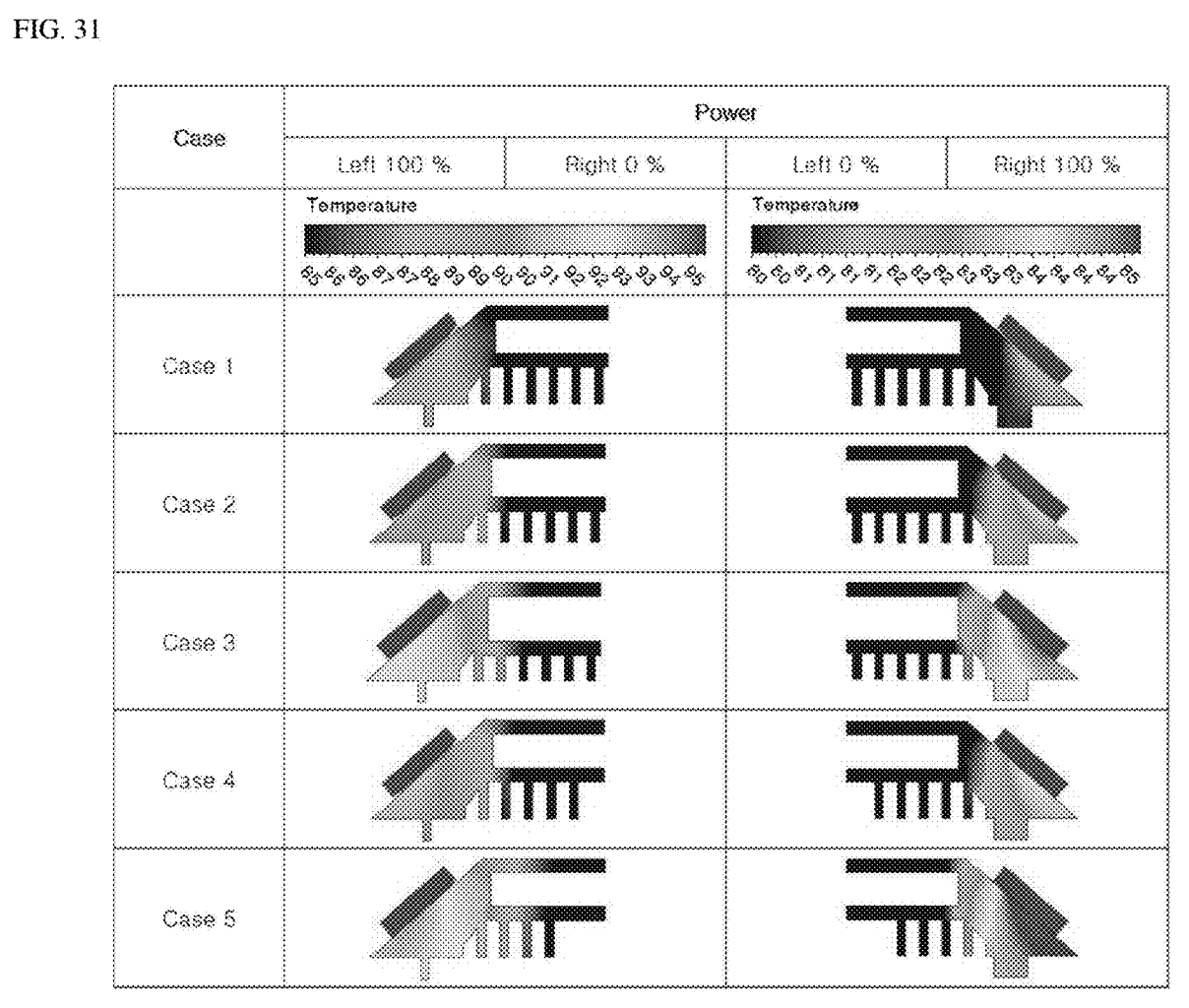

FIGS. 30 to 32 show results of a fifth simulation. Referring to FIGS. 30 to 32, the fifth simulation is performed in 6 cases. The 6 cases are described as follows.

Default Case: Horizontal heat sink in first simulation

Case 1: Set height of first air flow path to 6 mm in case 2 of first simulation

Case 2: Set height of first air flow path to 7 mm in case 2 of first simulation

Case 3: Set height of first air flow path to 8 mm in case 2 of first simulation

Case 5: Remove 2 heat dissipation fins in case 1

Case 6: Remove 4 heat dissipation fins in case 1

Referring to FIGS. 30 to 32, the electronic elements have the lowest temperature in case 1. Additionally, as a height of the first air flow path increases, the cooling efficiency of the heat sink decreases. Further, as a number of the heat dissipation fins decreases, the cooling efficiency decreases.

FIG. 33 shows results of a sixth simulation in the disclosure. Referring to FIG. 33, the sixth simulation is performed in 2 cases. The 6 cases are described as follows.

Default Case: Horizontal heat sink of first simulation

Case 1: Case 1 of fifth simulation

Referring to FIG. 33, the cooling efficiency in case 1 in is greater than in the default case. The heat sink 71 in one embodiment corresponds to the heat sink in case 1 of the sixth simulation.

In summary, in the electric range according to an embodiment, the first air flow path 711 is formed in the heat sink 71, and the lower side of the heat sink 71 is defined by the second air flow path 740, thereby allowing air to efficiently flow into and out of the heat sink 71. Thus, the temperature of the heat sink 71 may decrease.

Additionally, in the electric range according to an embodiment, the plurality of heat dissipation fins 741 is formed on the wall of the second air flow path 740 in such a way that it protrudes downward, thereby increasing a contact surface between the heat sink 71 and air. Further, a projection is formed on at least one of the wall of the first air flow channel, the wall of the second air flow path, the outer surface of the plurality of heat dissipation fins, or the upper surface of the heat sink, thereby increasing a contact surface of the heat sink and the air further. Thus, the cooling efficiency of the heat sink 71 may increase.

Further, in the electric range according to an embodiment, the electronic elements 761, 762 are attached to the outer surface of the heat sink 71, thereby allowing cooling air to directly contact the electronic elements 761, 762. More specifically, in the electric range, the electronic elements 761, 762 are attached to the outer slanted surface 720a, 730b of the heat sink, the air guide is disposed in such a way that it surrounds the heat sink 71 to which the electronic elements 761, 762 are attached, and air flows in the air guide 85 with the air blowing fan 80, thereby enabling the flowing air to directly contact the electronic elements 761, 762 and enhancing the cooling efficiency of the electronic elements 761, 762.

In the electric range according to an embodiment, positions of the electronic elements 761, 762 to be attached to the outer surface of the heat sink 71 may be set based on a heat resistant temperature of the electronic elements. Thus, the temperature of the electronic elements 761, 762 may be prevented from exceeding the heat resistant temperature, and finally, damage to the electronic elements 761, 762 may be prevented.

In the electric range according to an embodiment, a mounting structure of the air blowing fan 80 may be set based on a difference in temperature on both sides of the heat sink 71. Thus, the temperature may be evenly distributed in an entire area of the heat sink 71.

In the electric range according to an embodiment, the first air flow path 711 is formed in the heat sink 71, thereby allowing air to flow into the heat sink 71 efficiently and minimizing a difference in the temperature on both sides of the heat sink 71.

Embodiments disclosed herein provide a home appliance that ensures improvement in cooling efficiency of electronic elements cooled by a heat sink. Embodiments disclosed herein further provide a home appliance that ensures an increase in a contact surface between a heat sink and air.

Embodiments disclosed herein provide a home appliance that directly cools electronic elements attached to a heat sink. Embodiments disclosed herein also provide a home appliance that controls a plurality of heaters using a single drive circuit and a single heat sink.

Advantages according to embodiments disclosed herein are not limited to the above advantages, and other advantages that are not mentioned above may be clearly understood from the description and may be more clearly understood from the embodiments set forth herein.

For a home appliance according to an embodiment, a first air flow path may be formed in a heat sink, and a second air flow path may be defined at a lower side of the heat sink, such that air may flow to an inside and outside of the heat sink efficiently. Additionally, in the home appliance according to an embodiment, a plurality of heat dissipation members or fins may protrude downward from a wall of the second air flow path, increasing a contact surface between the heat sink and air.

Further, in the home appliance according to an embodiment, a projection part or projection may be formed on at least one of the wall of the first air flow path, the wall of the second air flow path, the outer surface of the plurality of heat dissipation fins, or the upper surface of the heat sink, increasing the contact surface between the heat sink and air further. In the home appliance according to an embodiment, electronic elements may be attached to an outer surface of the heat sink, enabling air to directly contact the electronic elements.

A home appliance of another embodiment may include a circuit board on which a plurality of electronic elements is disposed, and a heat sink which is mounted on the circuit board. The home appliance may include a first portion in which a first air flow path having a hollow hole shape is formed, a second portion that connects in such a way that it is inclined downward from a first side of the first portion, and a third portion that connects in such a way that it is inclined downward from a second side of the first portion. Additionally, a lower surface of the first portion, an inner slanted surface of the second portion, and an inner slanted surface of the third portion may define a second air flow path.

A home appliance according to an embodiment may include a case, a cover plate coupled to an upper end of the case, a plurality of heating parts or heaters disposed under the cover plate, a circuit board with a drive circuit that drives the plurality of heaters, a heat sink mounted on the circuit board, and an air blowing fan spaced from the heat sink, and supplying air to the heat sink. The heat sink may be formed into a cuboid having a trapezoid-shaped front surface and a trapezoid-shaped rear surface, and first and second air flow paths that provide a flow path of air discharged from the air blowing fan. The first air flow path may be formed under the second air flow path, and the second air flow path have a heat dissipation member or fin that is disposed vertically.

The heat sink according to an embodiment may be mounted on the circuit board of the home appliance, and include a first portion in which a first air flow path having a hollow hole shape may be formed, a second portion that connects in such a way that it is inclined downward from a first side of the first portion, and a third portion that connects in such a way that it is inclined downward from a second side of the first portion. A lower surface of the first portion, an inner slanted surface of the second portion, and an inner slanted surface of the third portion may define the second air flow path.

According to embodiments disclosed herein, air may flow to inside and outside of the heat sink through the first and second air flow paths efficiently, reducing temperature of the heat sink. Further, according to embodiments disclosed herein, a contact surface between the heat sink and air may increase, improving cooling efficiency of the heat sink. Furthermore, according to embodiments disclosed herein, air may directly contact the electronic elements attached to the heat sink, improving cooling efficiency of the electronic elements further.

Specific advantages are described along with the above-described advantages in the detailed description.

The subject matter of embodiments is described with reference to particulars such as the components and the like, the limited embodiments and the limited drawings, but they are provided for a comprehensive understanding of the subject matter. Embodiments are not limited to the embodiments set forth herein, and those of ordinary skill in the art to which the embodiments pertain can understand that various modifications and changes are drawn from the particulars, embodiments and drawings. Thus, the technical scope should not be limitedly defined by the embodiment described herein, and the claims, and the equivalents and modifications thereof should be included in the technical scope.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A home appliance, comprising:
   a circuit board on which a plurality of electronic elements is disposed; and
   a heat sink mounted on the circuit board, the heat sink comprising:

a first portion in which a first air flow path having a hollow hole shape is formed;

a second portion that is inclined downward from a first side of the first portion; and a third portion that is inclined downward from a second side of the first portion, wherein a lower surface of the first portion, an inner slanted surface of the second portion, and an inner slanted surface of the third portion define a second air flow path.

2. The home appliance of claim 1, wherein the lower surface of the first portion is disposed at a height greater than a lower surface of the second portion and a lower surface of the third portion.

3. The home appliance of claim 1, wherein at least one first projection is formed on an upper surface of the first portion and extends in a lengthwise direction of the heat sink.

4. The home appliance of claim 3, wherein at least one second projection is formed in at least a portion of walls of the first air flow path and extends in a lengthwise direction of the heat sink.

5. The home appliance of claim 4, further comprising:

a plurality of heat dissipation fins that protrudes downward from a wall of the second air flow path, wherein walls of the second air flow path corresponds to the lower surface of the first portion, the inner slanted surface of the second portion, and the inner slanted surface of the third portion.

6. The home appliance of claim 5, wherein each of the plurality of heat dissipation fins extends in the lengthwise direction of the heat sink.

7. The home appliance of claim 5, wherein a third projection is formed on outer surfaces of at least a portion of the plurality of heat dissipation fins.

8. The home appliance of claim 7, wherein a fourth projection is formed on a wall of the second air flow path in the lengthwise direction of the heat sink.

9. The home appliance of claim 7, wherein a coupling member is formed respectively on a lower surface of the second portion and a lower surface of the third portion, wherein the heat sink is mounted on the circuit board by the coupling member, and wherein a projection is formed on an outer surface of the coupling member.

10. The home appliance of claim 5, wherein the plurality of heat dissipation fins is spaced at predetermined intervals.

11. The home appliance of claim 5, wherein a lower end of the plurality of heat dissipation fins is respectively spaced from the printed circuit board at a regular interval.

12. The home appliance of claim 5, wherein the plurality of heat dissipation fins has a maximum height to an extent that the plurality of heat dissipation fins does not interfere with an electronic element disposed under the heat sink among the plurality of electronic elements.

13. The home appliance of claim 1, wherein the first portion, the second portion, and the third portion are formed integrally.

14. The home appliance of claim 1, wherein the second portion and the third portion have a slant angle of at least 40 degrees, and wherein the first air flow path has a height of at least 6 mm.

15. The home appliance of claim 1, wherein a portion of the plurality of electronic elements is attached to outer slanted surfaces of the second and third portions of the heat sink.

16. The home appliance of claim 1, further comprising:

a base bracket on which the circuit board is mounted; and an air blowing fan spaced apart from the heat sink, mounted on the base bracket, and configured to supply air to the heat sink, wherein air discharged from the air blowing fan is supplied to an upper surface of the first portion, outer slanted surfaces of the second and third portions, and the first and second air flow paths.

17. The home appliance of claim 16, further comprising:

an air guide that is mounted on the circuit board, surrounds the heat sink, and guides air supplied by the air blowing fan.

18. The home appliance of claim 1, further comprising:

a case;

a cover plate coupled to an upper end of the case;

a plurality of heaters disposed under the cover plate;

the circuit board, which has a drive circuit that drives the plurality of heaters;

the heat sink mounted on the circuit board; and an air blowing fan that is spaced from the heat sink and supplies air to the heat sink, wherein the heat sink is formed into a cuboid having a trapezoid-shaped front surface and a trapezoid-shaped rear surface, wherein the heat sink includes the first air flow path and the second air flow path that provide a flow path of air discharged from the air blowing fan, wherein the first air flow path is formed under the second air flow path, and wherein the second air flow path has at least one heat dissipation fin that extends vertically.

*  *  *  *  *